United States Patent
Yao et al.

(10) Patent No.: US 12,349,714 B2
(45) Date of Patent: Jul. 8, 2025

(54) FLOUR-BASED SHAPE-CHANGING FOOD AND RELATED METHODS

(71) Applicants: CARNEGIE MELLON UNIVERSITY, Pittsburgh, PA (US); BARILLA G. & R. FRATELLI S.p.A., Parma (IT)

(72) Inventors: Lining Yao, Pittsburgh, PA (US); Humphrey Yang, Pittsburgh, PA (US); Youngwook Do, Pittsburgh, PA (US); Catherine Mondoa, Pittsburgh, PA (US); Guanyun Wang, Pittsburgh, PA (US); Jianxun Cui, Pittsburgh, PA (US); Wen Wang, Pittsburgh, PA (US); Yi-Chin Lee, Pittsburgh, PA (US); Ye Tao, Pittsburgh, PA (US); Claudia Berti, Parma (IT); Elena Berte, Parma (IT); Elena Bergamini, Brescello (IT)

(73) Assignees: CARNEGIE MELLON UNIVERSITY, Pittsburgh, PA (US); BARILLA G. & R. FRATELLI S.p.A., Parma (IT)

( * ) Notice: Subject to any disclaimer, the term of this patent is extended or adjusted under 35 U.S.C. 154(b) by 589 days.

(21) Appl. No.: 17/621,285

(22) PCT Filed: Jun. 22, 2020

(86) PCT No.: PCT/US2020/039019
§ 371 (c)(1),
(2) Date: Dec. 21, 2021

(87) PCT Pub. No.: WO2020/257801
PCT Pub. Date: Dec. 24, 2020

(65) Prior Publication Data
US 2022/0354134 A1    Nov. 10, 2022

Related U.S. Application Data

(60) Provisional application No. 62/869,753, filed on Jul. 2, 2019, provisional application No. 62/864,547, filed on Jun. 21, 2019.

(51) Int. Cl.
| | |
|---|---|
| *A23L 7/109* | (2016.01) |
| *A21D 13/11* | (2017.01) |
| *A21D 13/40* | (2017.01) |
| *A21D 13/42* | (2017.01) |
| *A21D 13/80* | (2017.01) |
| *A23P 20/20* | (2016.01) |
| *A23P 30/10* | (2016.01) |
| *B29C 59/00* | (2006.01) |
| *B32B 3/30* | (2006.01) |
| *B32B 7/02* | (2019.01) |
| *B32B 9/00* | (2006.01) |
| *B32B 9/04* | (2006.01) |
| *B32B 25/08* | (2006.01) |
| *B32B 25/20* | (2006.01) |
| *B32B 27/28* | (2006.01) |
| *G06F 30/17* | (2020.01) |
| *B29K 83/00* | (2006.01) |

(52) U.S. Cl.
CPC ........... *A23L 7/11* (2016.08); *A21D 13/11* (2017.01); *A21D 13/40* (2017.01); *A21D 13/42* (2017.01); *A21D 13/80* (2017.01); *A23L 7/109* (2016.08); *A23P 20/20* (2016.08); *A23P 30/10* (2016.08); *B29C 59/007* (2013.01); *B32B 3/30* (2013.01); *B32B 7/02* (2013.01); *B32B 9/005* (2013.01); *B32B 9/04* (2013.01); *B32B 9/043* (2013.01); *B32B 9/045* (2013.01); *B32B 25/08* (2013.01); *B32B 25/20* (2013.01); *B32B 27/283* (2013.01); *G06F 30/17* (2020.01); *A23V 2002/00* (2013.01); *B29K 2083/00* (2013.01); *B32B 2307/732* (2013.01)

(58) Field of Classification Search
None
See application file for complete search history.

(56) References Cited

U.S. PATENT DOCUMENTS

| | | | |
|---|---|---|---|
| 4,591,328 | A | 5/1986 | Cheung |
| 5,695,804 | A | 12/1997 | Hnat et al. |
| 2001/0036498 | A1 | 11/2001 | Blaschke et al. |
| 2003/0150337 | A1 | 8/2003 | Ancona et al. |
| 2018/0103678 | A1 | 4/2018 | Wang et al. |

FOREIGN PATENT DOCUMENTS

| | | | | |
|---|---|---|---|---|
| FR | 2495442 A1 | * | 6/1982 | ............... A21D 2/34 |
| JP | H03280849 A | | 12/1991 | |
| JP | 2008043248 A | | 2/2008 | |

(Continued)

OTHER PUBLICATIONS

Miyata et al. JP 2015-195767, Nov. 9, 2015, Machine Translation.*
Foreign reference (Year: 1982) machine translation of Fr 2495442A1.*
International Search Report and Written Opinion of the International Searching Authority for PCT Application PCT/US2020/039019 dated Dec. 18, 2020.
Tao, Y. et al. "Morphlour: personalized flour-based morphing food induced by dehydration or hydration method." In Proceedings of the 32nd Annual ACM Symposium on User Interface Software and Technology, pp. 329-340. 2019.

(Continued)

*Primary Examiner* — Jyoti Chawla
(74) *Attorney, Agent, or Firm* — David G. Oberdick; Chiara F. Orsini

(57) ABSTRACT

Methods for creating semolina flour-based shape-changing food from a multi-layered dough with at least one grooved surface. The dough layers have difference compositions including natural, staple and edible ingredients. The dough is exposed to stimuli during dehydration (e.g., baking) or hydration (e.g., boiling) processes.

12 Claims, 29 Drawing Sheets

(56) References Cited

FOREIGN PATENT DOCUMENTS

JP            2015195767 A      11/2015
JP            2019076049 A       5/2019

OTHER PUBLICATIONS

Yang. Morphlour, YouTube, https://www.youtube.com/watch?v=0P9au3S9fXI&feature=emb_logo. Nov. 27, 2018. (Not prior art).
European Search Report for Application No. 20825580.2 dated Jun. 5, 2023.
Singapore Search Report for Application No. 11202113893P dated Oct. 17, 2023.
Singapore Written Opinion for Application No. 11202113893P dated Oct. 18, 2023.
Wang, W. et al. "Transformative appetite: shape-changing food transforms from 2D to 3D by water interaction through cooking." In Proceedings of the 2017 CHI conference on human factors in computing systems, pp. 6123-6132. 2017.

* cited by examiner

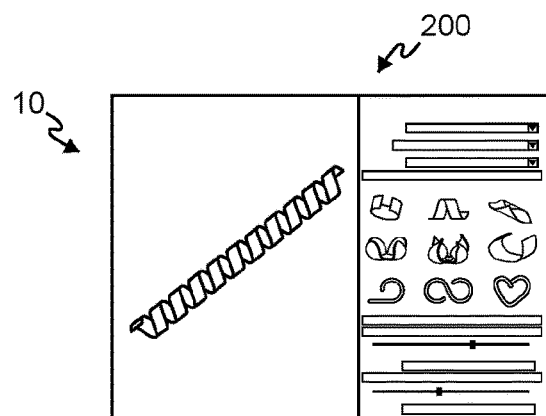
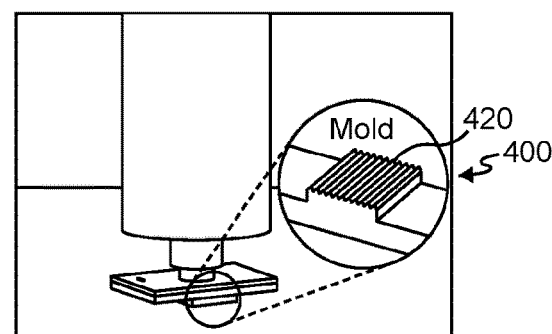
FIG. 3A  FIG. 3B
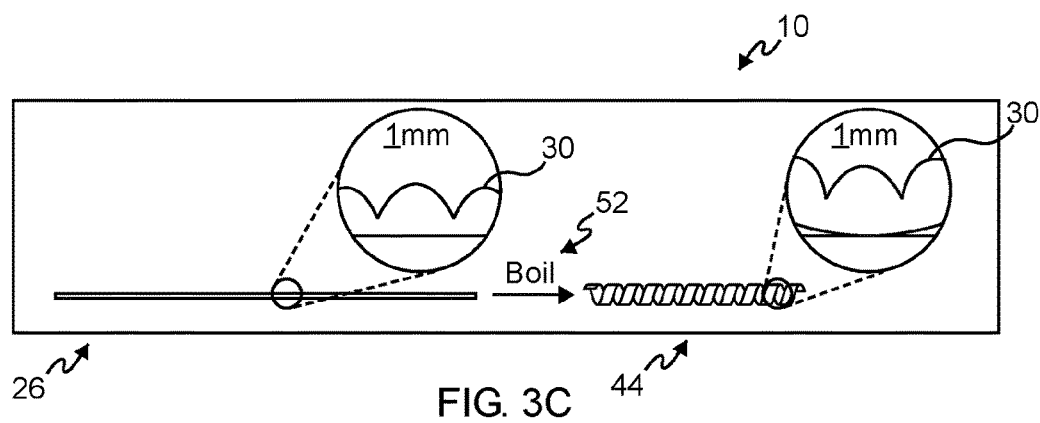
FIG. 3C
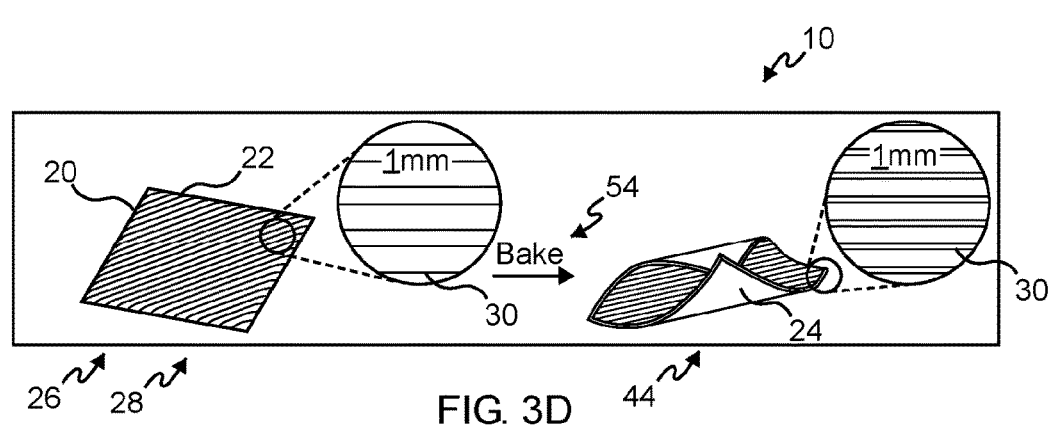
FIG. 3D

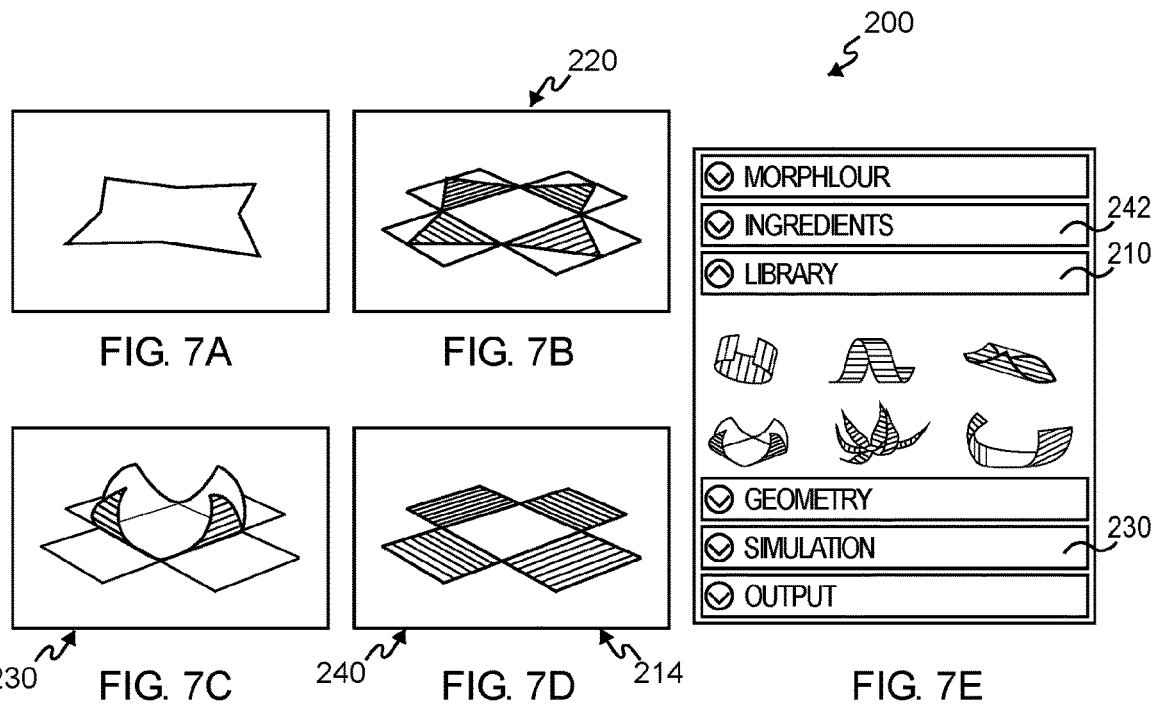
FIG. 7A  FIG. 7B
FIG. 7C  FIG. 7D  FIG. 7E
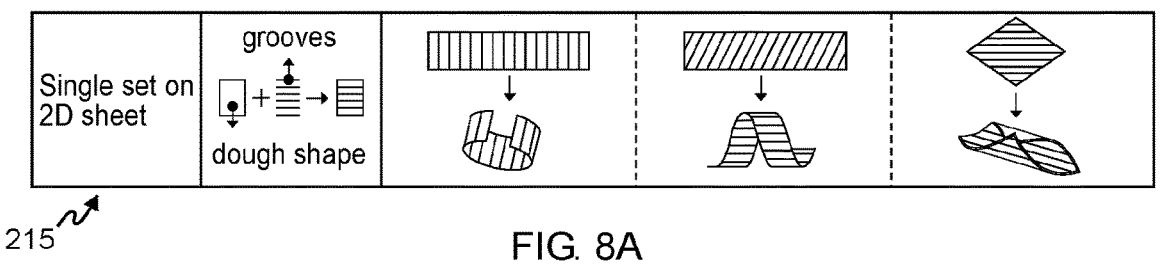
FIG. 8A
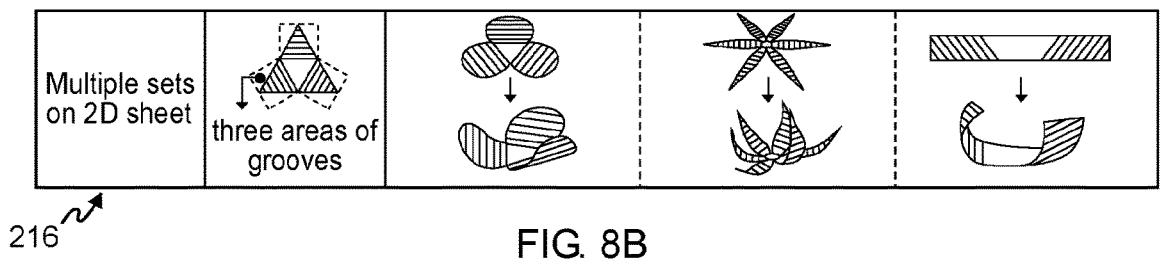
FIG. 8B
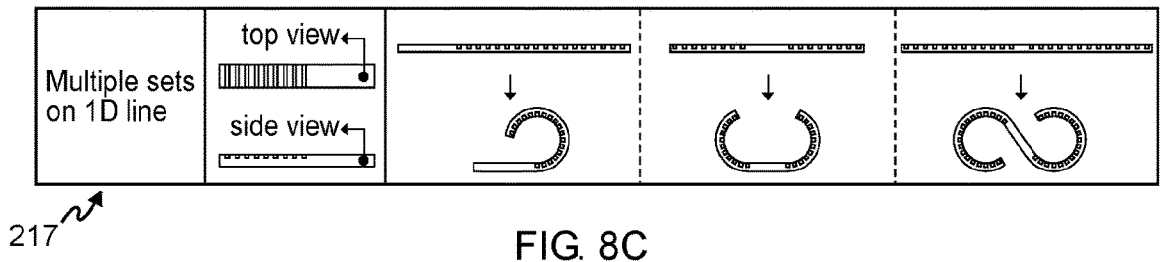
FIG. 8C

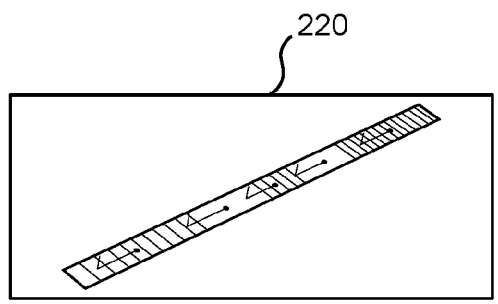
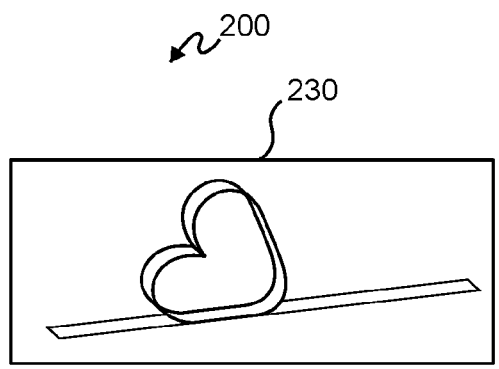
FIG. 22A     FIG. 22B
FIG. 22C
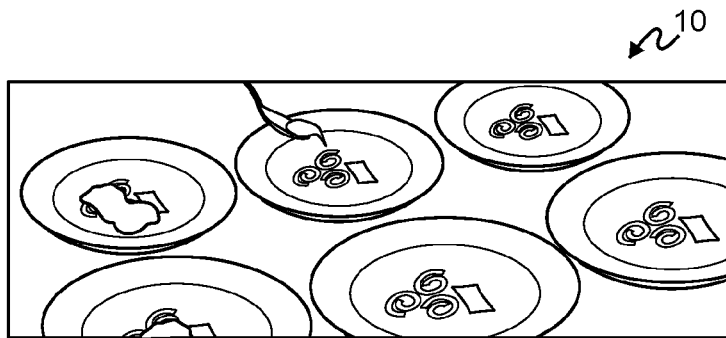
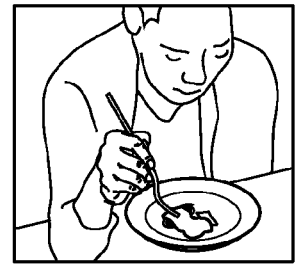
FIG. 23A     FIG. 23B

| Roller No. | 1 | 2 | 3 | 4 | 5 |
|---|---|---|---|---|---|
| Thickness (mm) | ~3.3 | ~3.0 | ~2.0 | ~1.6 | ~1.1 |
| Dehydration | 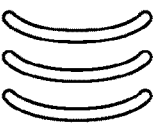 |  |  |  |  |
FIG. 25A
| Roller No. | 1 | 2 | 3 | 4 | 5 |
|---|---|---|---|---|---|
| Thickness (mm) | ~3.3 | ~3.0 | ~2.0 | ~1.6 | ~1.1 |
| Hydration state in the water |  | 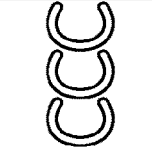 | 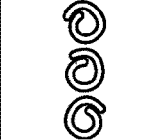 | 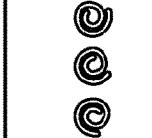 | 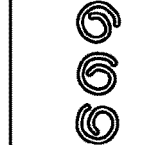 |
FIG. 25B
| Roller No. | 1 | 2 | 3 | 4 | 5 |
|---|---|---|---|---|---|
| Thickness (mm) | ~3.3 | ~3.0 | ~2.0 | ~1.6 | ~1.1 |
| Hydration state out of the water |  |  | 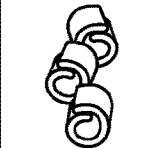 | 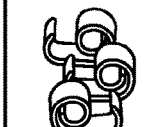 | 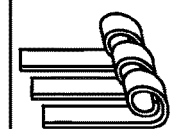 |
FIG. 25C

| Library | Groove Instruction | 2D Design (mm) | 3D Simulation | 2D Experiment | 3D Result |
|---|---|---|---|---|---|
| 215 (a) Single set of grooves on 2D sheet | a1: Cannoli<br>Type: parallel<br>Angle: 0°<br>Depth: 1.8mm<br>Area: single on one side | 48 | | | |
| top view | a2: Helix<br>Type: parallel<br>Angle: 80°<br>Depth: 1.8mm<br>Area: single on one side | 10, 60 | | | |
| dough shape + types of grooves | a3: Bamboo<br>Type: parallel<br>Angle: 90°<br>Depth: 1.8mm<br>Area: single on one side | 35, 15, 20, 20 | | | |
| | a4: Speaker<br>Type: rayed<br>Angle: multiple<br>Depth: 1.8mm<br>Area: single on one side | 10, 9 | | | |

FIG. 28A

| Library | Groove Instruction | 2D Design (mm) | 3D Simulation | 2D Experiment | 3D Result |
|---|---|---|---|---|---|
| 216 (b) Multiple sets of grooves on 2D sheet | b1: Flower<br>Type: parallel<br>Angle: 0°, 90°<br>Depth: 1.8mm<br>Area: four on one side | 70 | | | |
| top view | b2: Wave<br>Type: parallel<br>Angle: 90°<br>Depth: 1.8mm<br>Area: three on double sides | 15 15 15, 20 | | | |
| dough shape + areas of grooves + types of grooves | b3: Cavel<br>Type: rayed<br>Angle: multiple<br>Depth: 1.8mm<br>Area: three on one side | 56, 5 | | | |
| | b4: Chips<br>Type: rayed<br>Angle: multiple<br>Depth: 1.8mm<br>Area: four on double sides | 38 | | | |

FIG. 28B

| Library | Groove Instruction | 2D Design (mm) | 3D Simulation | 2D Experiment | 3D Result |
|---|---|---|---|---|---|
| 217 (2) Multiple sets of grooves on 1D line | c1: No. 6<br>Type: parallel<br>Angle: 90°<br>Depth: 1.8mm<br>Area: single on one side | 20 45, 4 | | | |
| fixed trigger position in side view<br>top view | c2: Character C<br>Type: parallel<br>Angle: 90°<br>Depth: 1.8mm<br>Area: two on one side | 15 10 15, 4 | | | |
| linear dough shape + areas of grooves + types of grooves | c3: Heart<br>Type: parallel<br>Angle: 90°<br>Depth: 1.8mm<br>Area: three on one side | 20 10 30 10 20, 4 | | | |
| | c4: Character S<br>Type: parallel<br>Angle: 90°<br>Depth: 1.8mm<br>Area: two on double sides | 30 30, 4 | | | |

FIG. 28C $$\Theta = \frac{\sqrt{3}R^2 - \frac{1}{2}\pi R^2 + \frac{1}{2}\pi r^2}{\sqrt{3}R^2}$$

FLOUR-BASED SHAPE-CHANGING FOOD AND RELATED METHODS

CROSS-REFERENCE TO RELATED APPLICATION

This application is a PCT International Application claiming priority to U.S. Provisional Application Ser. No. 62/864,547, filed on Jun. 21, 2019 and U.S. Provisional Application Ser. No. 62/869,753, filed on Jul. 2, 2019, both applications are incorporated by reference herein in their entirety.

BACKGROUND OF THE INVENTION

Field of the Invention

From Chinese dumplings, Japanese ramen, and Italian pasta, to Mexican tortillas and French breads, flour plays an important role in our civilization and supplies energy as a staple food across cultures and history. The present invention demonstrates how advanced digital fabrication with material driven design transforms the way flour-based food is prepared and consumed through shape-changing techniques.

Description of Related Art

Previously, shape-changing food has been introduced to the human-computer interaction ("HCI") community as a design concept. In particular, the pasta shape-changing property has been demonstrated with a gelatin/cellulose mixture and chitosan. However, these edible proteins, or polysaccharides-based materials, are not conventionally used to make authentic pasta for our daily consumption and energy supply. It is necessary to re-engineer the material components of pasta with advanced digital fabrication tools to add utility to the design.

The present invention introduces a new stimulus (dehydration via baking) to trigger food shape-change during cooking upon a new edible material—flour-based food. Besides this, the present invention also encompasses a new shape-changing mechanism through hydration (via boiling) for flour-based authentic pasta to obtain shape-changing behavior. Both dehydration and hydration methodologies are accomplished through digital fabrication by understanding the material compositions and the mechanical behaviors. The present invention encompasses the details of how to make shape-changing flour-based foods from the aspects of understanding its material behavior, design and fabrication tools.

Shape-Changing Food: Previously, shape-changing food has been explored with different materials and triggering mechanisms, including pneumatic-driven inflatable bread, water swelling induced shape-changing gelatin-cellulose-based pasta, and pH responsive chitosan-based shape-changing noodles.

The present invention focuses on flour-based food. Compared to the previous work on shape-changing food, the differences are manifold. First, the transformation mechanisms are different. While literature introduces bi-layer composition, the present invention uses grooving patterns (surface texture modification) as the major transformation mechanism. Second, the present invention focuses on both dehydration and hydration processes with a unified design and fabrication process. Third, the present invention uses natural ingredients that are functional for energy supply purposes, (i.e., in some embodiments of the present invention the shape-changing flour-based food examples are majorly composed of semolina.) In Italy, egg whites and oat fiber (as additives) are commonly used in pasta and recommended by professional pasta producers. Consequently, shape-changing foods according to the present invention can produce authentic flavor, nutrition and mouthfeel, and be considered to be a natural food with utility.

Digital Fabrication in Food: Recent products and research projects have enabled digital technology to customize the shape, color, flavor, texture and even nutrition of food. For instance, Digital Gastronomy integrated existing digital fabrication instruments into traditional kitchens, allowing chefs to personalize dishes. Digital Konditorei merged a modular mold and a genetic mold-arrangement algorithm to control the taste structures in the dish. Additionally, there are an increasing number of projects which provide diverse engineering solutions for digitalized food design and nutrition control. Moreover, robotics-based food manufacturing technologies are emerging to automate traditional manual processes. With the advent of digital fabrication technology enabled by computer controlled machines, increased food properties can be prompted to be explored in production and cooking procedures, and the present invention's shape changing food opens a promising new territory for the future of digital food technologies.

User Experience with Food in HCI: Within the HCI community, recent research papers on human-food interaction play an important role in understanding the importance of food in our daily lives. More edible user interfaces have been created as a playful interaction modality. For instance, EdiPulse, an interactive Chocolate Machine, creates activity treats which support physical activity by offering playful reflections to facilitate self-control and to deter undesirable behaviors. See F. Kehr, M. Hassenzahl, M. Laschke, S. Diefenbach 2012. *A Transformational Product To Improve Self-Control Strength: The Chocolate Machine* (*Proceedings of the SIGCHI Conference on Human Factors in Computing Systems,* 689-694). Moreover, food related products and interfaces offer a new channel to explore how people interact with food, such as food journals and food photographs. In addition, research continues to explore the ecological value of food, especially as it relates to food waste.

Shape-Changing Materials in HCI: Recently, shape-changing materials have been used in a variety of HCI contexts, leveraging the morphing material's characteristics to create novel interactive affordances. To the extent that researchers in this field have reviewed novel shape-changing interfaces with variable material properties, their research has focused on transformative materials that respond to one stimuli type. The present invention expands upon prior research in a novel manner by introducing one food material mechanism triggered by two different stimuli types; thereby, broadening this approach to more food applications.

Challenges in Flour-based Shape-Changing Mechanisms: In material science, one of the most common methods for generating a shape-changing effect for a sheet involves constructing a bi-layer structure with different expansion or contraction rates under specific stimuli (e.g. water diffusion) . However, the bilayer structure alone is not effective for flour-based dough samples.

In previous research it has been explained that edible materials can swell differently: agar, gelatin, starch and cellulose have different swelling rates and by composing these raw ingredients into bi-layer or tri-layer composites, self-folding can be achieved during the hydration process. See W. Wang, L. Yao, T. Zhang, C. Y. Cheng, D. Levine, H. Ishii 2017. *Transformative Appetite: Shape-Changing Food*

Transforms from 2D to 3D by Water Interaction through Cooking (*Proceedings of the CHI* 2017, 6123-6132). Replicating the same mechanism for re-creating a bi-layer structure with authentic flour-based ingredients presents challenges, however, due to the different mechanical properties of flour dough.

As FIG. 2 shows, flour and flour-oat fiber bi-layer dough shows a bending angle smaller than 5 degrees (some effect by the layering of dough but not a dramatic bending effect). In this experiment, the plain dough contained 112 g flour and 43 g water, and the flour-oat fiber dough contained 112 g flour, 42 g oat fiber and 125 g water. The sample size was 50 mm in length, 15 mm in width and 2 mm in thickness.

In addition, flour brings newer challenges to the manufacturing process. Standard pasta dough has much higher viscosity than gelatin (the base material for Transformative Appetite) or chitosan (the base material for Organic Primitives), both materials have been the subject of previous research in the field. Additionally, the gluten network within the flour dough makes it impossible to use either the same film making procedures reported previously or other alternative manufacturing methods reported for hydration-based shape changing materials beyond food applications. Instead of dissolving the raw ingredients in water or organic solvents, the present invention includes an adaptation of the classic method of sheets production in cooking—kneading the dough with a dough mixer and sheeting it with a pasta sheeter. Multi-layer composite sheets can be produced, which are detailed herein.

To tackle the aforementioned challenges, the present invention introduces a novel mechanism that enables a flour-based dough to achieve a shape-changing property, namely, groove-induced differential swelling or shrinking. By grooving geometrical features on the surface of the sheeted dough (thereby modifying the surface texture), the present invention controls the swelling rate or dehydration rate of the material, which causes the pasta/dough to change shape.

Traditional Pasta Making: As context for the present invention, traditional pasta is made via a multistep process that involves the steps of mixing and kneading the dough; the optional addition of flavoring and coloring; rolling the dough into sheets; cutting the dough into specified shapes and sizes; and then, optionally, drying the dough. The technique that is used in the cutting/shaping steps depends upon the type of noodle being produced. In general, this step is accomplished either by cutting the dough with blades or by extruding the dough through dies. Ribbon and string-style pasta (fettucine, linguine, spaghetti, etc.) are cut via blades. Tube or shell-shaped pasta (rigatoni, elbow macaroni, etc.) are extruded through dies. The present invention includes, among other things, a novel method, system and device for creating shape-morphing dough by imprinting or grooving a design into flat dough to change the surface texture of the flat piece of dough.

BRIEF SUMMARY OF THE INVENTION

The present invention encompasses the following: mechanisms for authentic semolina flour-based shape-changing food during the dehydration (e.g., baking) or hydration (e.g., boiling) processes with natural, staple and edible ingredients for multi-layered doughs; shape-changing semolina flour-based foods based on multi-layered doughs; methods for creating shape-changing semolina flour-based foods from multi-layered doughs; and a method for creating pasta dough having a grooved surface and two or more dough layers with different compositions.

One embodiment of the present invention comprises a shape-changing food made from a flat piece of semolina flour-based dough, which has a top surface and a bottom surface and two or more dough layers having different compositions. The flat piece of semolina flour-based dough is cut to an initial shape and an initial size. Additionally, the top surface of the dough has at least one set of parallel grooves imprinted onto it, which run perpendicular to a predetermined bending direction of the dough. Finally, the at least one set of parallel grooves has a groove depth and a groove spacing chosen to achieve a predetermined bending angle or a predetermined final shape. In other embodiments, at least one groove or a at one set of non-parallel grooves also can be used.

Another embodiment of the present invention is a method for creating shape-changing food comprising the following steps: (1) imprinting or grooving at least one set of parallel grooves onto a semolina flour-based dough, the dough having a top surface and a bottom surface and two or more dough layers having different compositions, at an angle perpendicular to a predetermined bending angle and at a groove spacing and groove depth chosen to result in a predetermined final shape and/or a predetermined bending angle; and (2) exposing the semolina flour-based dough with the at least one set of parallel grooves to a stimuli to cause the flour-based dough to change shape.

Another embodiment of the present invention is a method for creating pasta dough having a grooved surface. The method of this embodiment comprises imprinting or grooving at least one set of parallel grooves onto the top surface of a flat semolina flour-based dough, wherein the dough has a top surface and a bottom surface and two or more dough layers having different compositions.

BRIEF DESCRIPTION OF THE SEVERAL VIEWS OF THE DRAWINGS

For the purpose of facilitating understanding of the invention, the accompanying drawings and descriptions illustrate preferred embodiments thereof, from which the invention, various embodiments of its structures, construction and method of operation and many advantages may be understood and appreciated. The accompanying drawings are hereby incorporated by reference.

FIGS. 3A through 3D show an overview of a manufacturing process according to one embodiment of the present invention;

FIGS. 7A through 7E illustrate one possible process implemented by one embodiment of a computational design tool according to the present invention;

FIGS. 8A through 8C show a design library comprised of a few select shaped designs according to one embodiment of the present invention;

FIGS. 22A through 22C show one embodiment of a design tool and the resulting transformation behaviors of food according to the present invention;

FIGS. 23A and 23B demonstrate a collection of user feedbacks on the present invention;

FIGS. 25A through 25C show samples to optimize thickness in bending performance and shape retentivity according to the present invention;

FIGS. 28A through 28C are one embodiment of a design library according to the present invention;

DETAILED DESCRIPTION OF THE INVENTION

The present invention will be understood more readily by reference to the following detailed description of the invention and the accompanying figures, which form a part of this disclosure. This invention is not limited to the specific devices, methods, processes, elements or parameters described and/or shown herein and the terminology used herein is for the purpose of describing particular embodiments and is by way of example only and not intended to be limiting of the claimed invention. Any and all patents and other publications identified in this specification are incorporated by reference as though fully set forth herein.

Also, as used in the specification including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

Figure 1A:
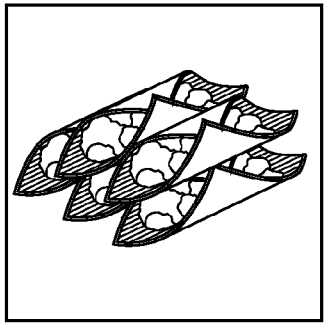
FIGS. 1A through 1F show various applications of the present invention with different types of food products.
Figure 1B:
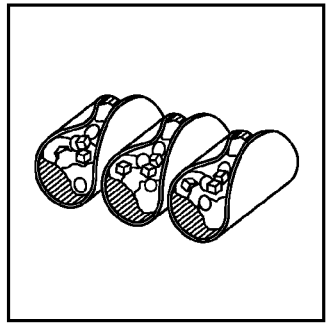
Figure 1C:
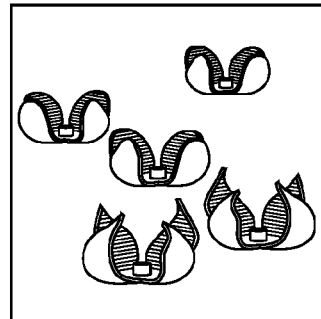
Figure 1D:
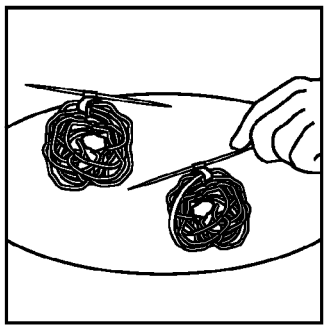
Figure 1E:
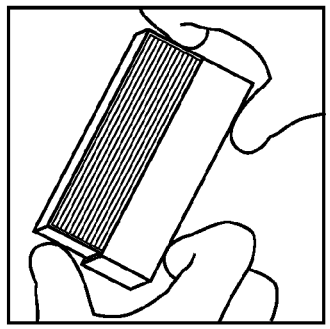
Figure 1F:
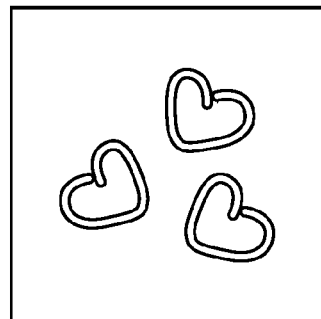
Figure 2:
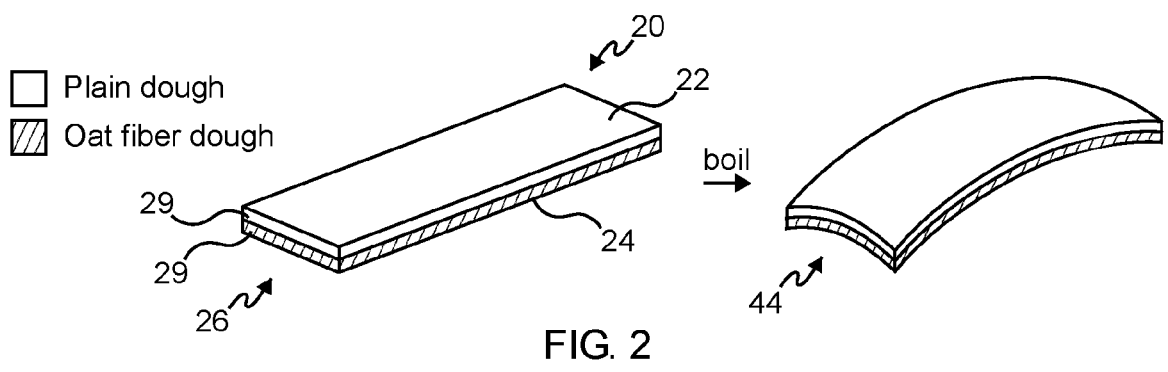
FIG. 2 demonstrates the limited bending effect of plain flour with an oat fiber bi-layer film.
Figure 30A:
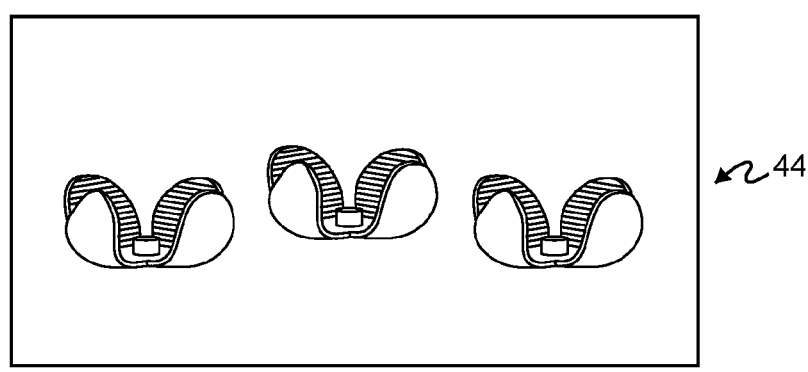
FIGS. 30A and 30B illustrate the repeatability of shapes using one method of the present invention.
Figure 30B:
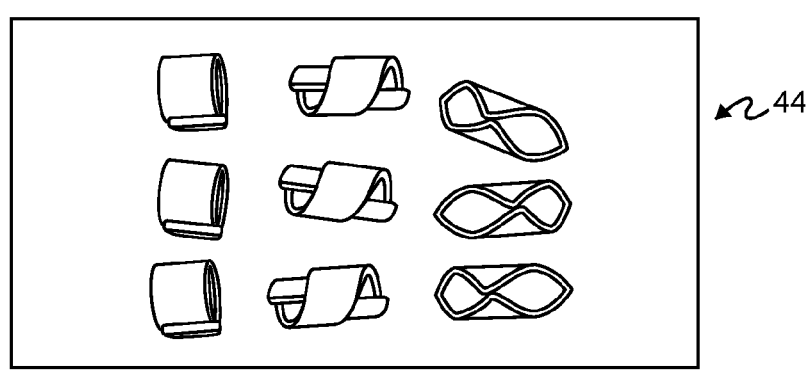
Figure 32A:
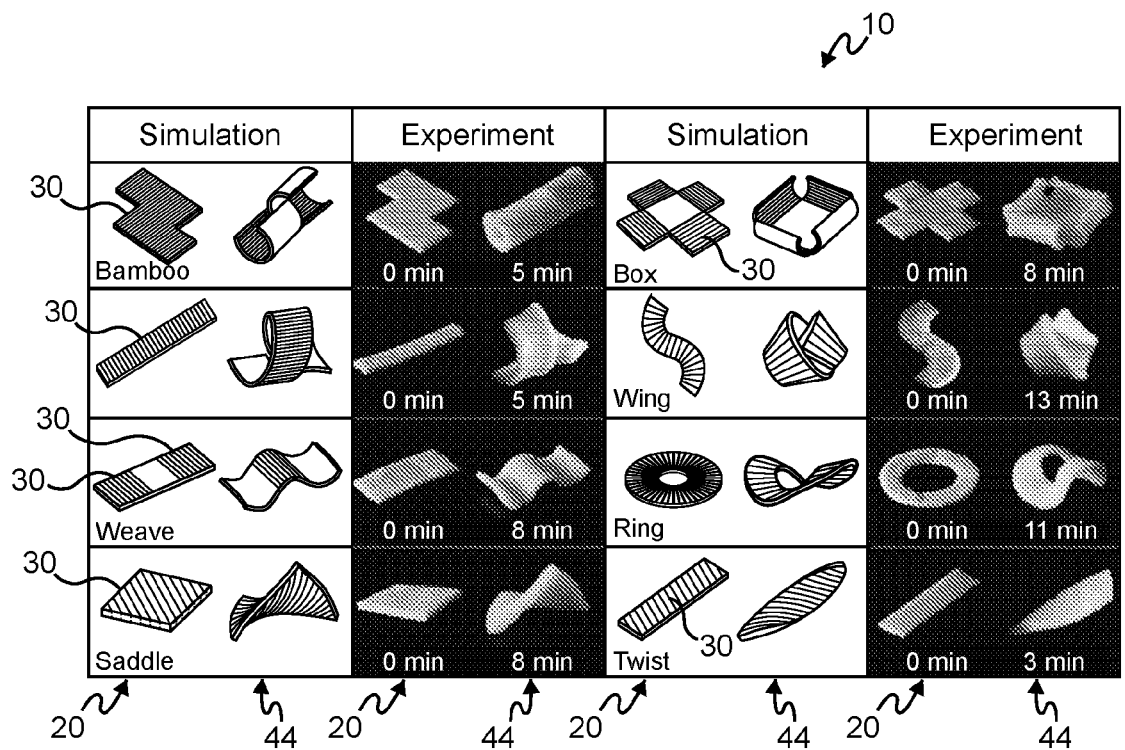
FIGS. 32A through 32E are examples of different geometries of shape-changing pastas and their possible applications.
Figure 32B:
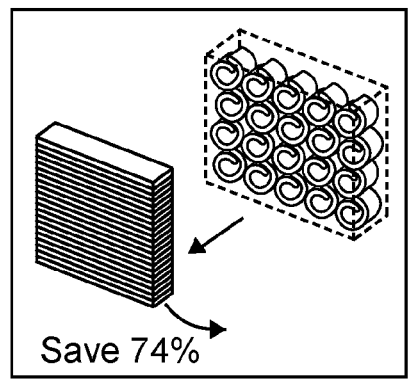
Figures 32C, 32D:
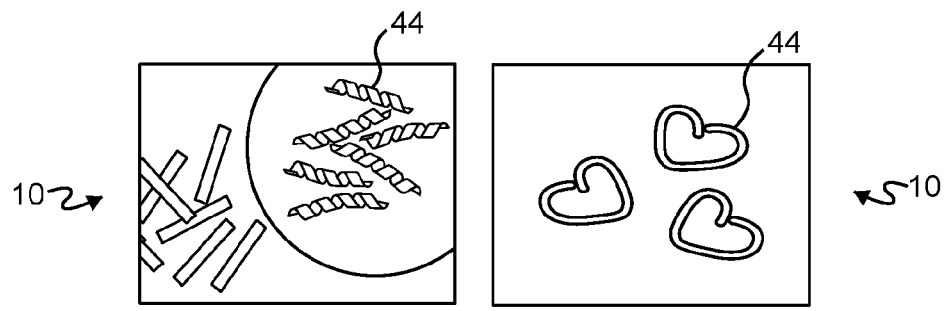
Figure 32E:
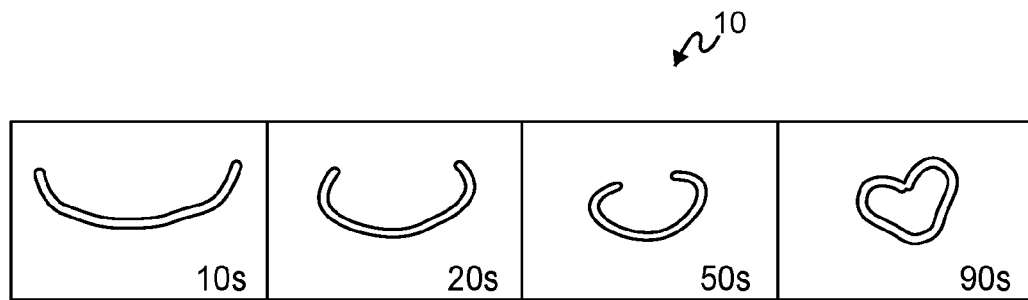

The present invention's flour-based shape-changing materials, foods 10, methods 100, devices, computational design tools 200 and digital fabrication processes 300 introduce an integrated design strategy for making shape-changing flour-based foods 10 during either dehydration 54 (e.g. baking, FIG. 30A) or hydration 52 (e.g. water boiling, FIG. 30B) cooking processes. FIGS. 30A and 30B also show the reliability and repeatability of producing food 10 of a desired or predetermined shape and bending angle 42 when utilizing the various embodiments of the present invention. This application includes a novel morphing mechanism—modifying the surface texture of dough 20 and more specifically, groove-induced differential swelling or shrinking; a design tool 200 (as shown in FIG. 3); and a digital fabrication platform 300 (also shown in FIG. 3) that are tailored to this novel mechanism. FIG. 3C shows a thin hair pasta noodle transforming into a dense coil when it is boiled (hydration 52). FIG. 3D shows a sheeted square piece of dough 20 turning into a dried cannoli wrap when it is baked (dehydration 54). FIG. 1 shows several applications of various embodiments of the present invention including:

self-wrapping cannoli (FIG. 1A); self-wrapping tacos (FIG. 1B); self-folding multi-flavored cookies (FIG. 1C); self-assembling noodles (FIG. 1D); flat-pack hiking food 10 (FIG. 1E); and shape customized pasta (FIG. 1F). FIG. 32A shows a variety of designs of novel pasta shapes (straight grooves, curved grooves, grooves on both sides) in 2D and actual pasta (from top to bottom: bamboo, container, spring, folded, wave, ring saddle, twisted) before and after cooking and shows the actual results compared with the simulation results (which can be obtained by simulating the 3D shape 230 with a computation design tool 200 according to one embodiment of the present invention). FIG. 32C demonstrates the utility of flat shape pasta transforming into fusilli pasta. Finally, 32D and 32E illustrate heart shaped pasta as a medium for communication enhancement.

The method 100, design tool 200 and digital fabrication process 300 described offer three possible embodiments of ways to make shape-changing food 10. The various shape-changing foods 10 are made from a flat piece of flour-based dough 20, which has a top surface 22 and a bottom surface 24. The flat piece of flour-based dough 20 is cut to a predetermined initial shape 26 and a predetermined initial size 28. Additionally, the top surface 22 of the dough 20 has at least one set of parallel grooves 30 running perpendicular to a predetermined bending direction 40 on it. Optionally, the bottom surface 24 of the dough 20 has at least one set of parallel grooves 30 running perpendicular to a predetermined bending direction 40 on it. For any sets of parallel grooves 30 on either the top surface 22 or the bottom surface 24, the grooves can cover all or part of the top surface 22 and/or bottom surface 24. Finally, the at least one set of parallel grooves 30 has a groove depth 32 and a groove spacing 34 chosen to achieve a predetermined bending angle 42 or a predetermined final shape 44. This grooved dough 20 is then exposed to a stimuli 50, such as hydration 52 or dehydration 54, which causes the flat piece of flour-based dough 20 to change shape or bend. This dough 20 can be made of one or more than one layers 29 of different doughs having different compositions and different thicknesses. The optional use of different layers 29 of dough 20 having different thicknesses, compositions, and/or different ratios of thicknesses impacts the bending angle 42 of the dough 20 and these factors can be varied to achieve predetermined bending angle 42 and/or predetermined final shapes 44. Alternatively, any one of these factors can be varied to achieve a predetermined bending angle 42 and/or predetermined final shapes 44. For example, the dough 20 can be comprised of layers 29 that have the same composition but different thicknesses or layers 29 that have different compositions but the same thicknesses or be made of only one layer of one composition of dough. The present invention's pastas and other flour-based foods 10 provide a traditional pasta and food taste, mouthfeel and cooking processes (hydration 52 and dehydration 54) with entirely novel shape-changing properties. These novel foods 10 provide distinct advantages over prior shape-changing food technologies and new applications for shape-changing foods 10.

Figure 5A:
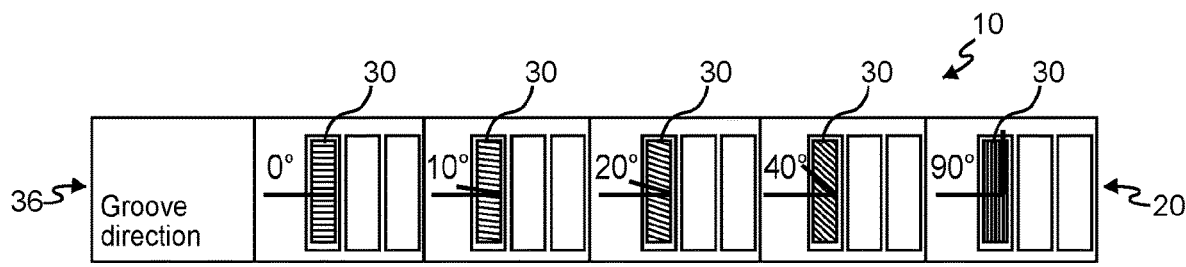
FIGS. 5A through 5C illustrate how parallel grooves with varied angles to the edges of the dough samples impact bending.
Figure 5B:
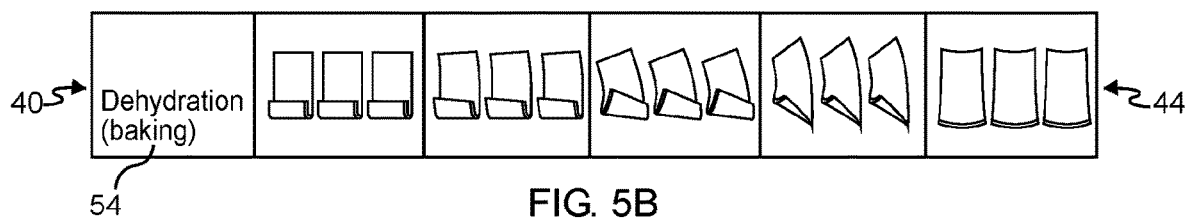
Figure 5C:
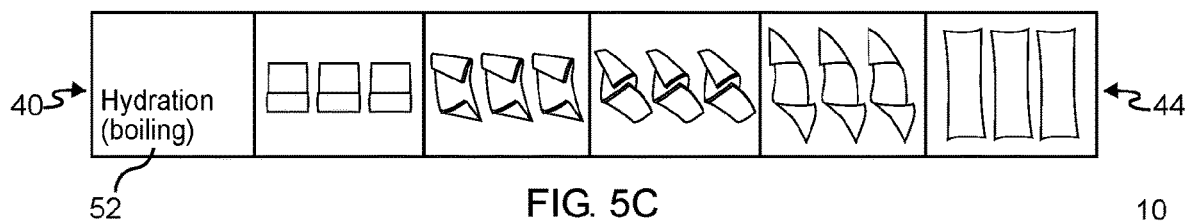

Overview of Hydration Stimuli and the Impact of Grooving Generally: The present invention utilizes the impact of grooving 110 geometrical features into the microstructure of at least one surface of flour-based dough 20 (FIGS. 5A through 5C). Reference is made herein to flat, flour-based dough 20, which has a "top surface" 22 and a "bottom surface" 24. Alternatively, the phrases "first surface" and "second surface" are used herein. The use of the phrases "top surface", "bottom surface", "upper surface", "lower surface", "first surface" and "second surface" are relative terms and merely mean that the flat dough 20 has two opposing surfaces, which can be interchangeable, with at least one of the two surfaces having grooves thereon. A "top surface" 22 is generally referring to the surface that is exposed during the grooving process 110. While the opposing "bottom surface" 24 is the surface that is resting on a support surface during the grooving process 110. By flipping the dough 20 over, the "top surface" 22 becomes the "bottom surface" 24 and vice versa. The various embodiments of the present invention encompass grooving 110 either or both surfaces to achieve one or a plurality of predetermined bending angles 42 on a piece of dough 20 and/or to achieve a final shape 44.

Figure 31A:
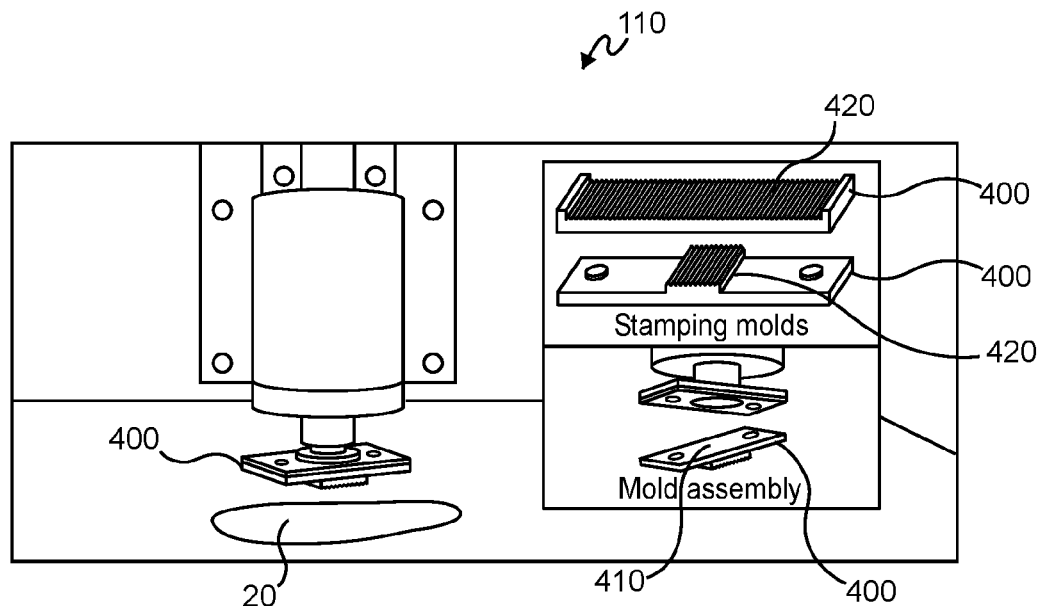
FIGS. 31A and 31B show one stamping method controlled by an automated machine gantry and the shape transformation of fusilli lunghi pasta (i.e., long spirals)
Figure 31B:
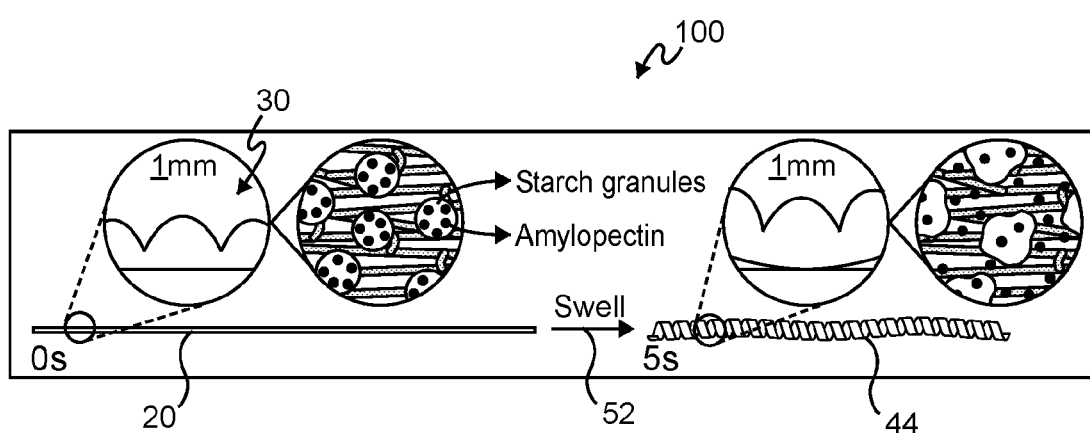

The grooving 110 of geometrical features on the surface of the sheeted dough 20 (thereby modifying the surface texture) controls and takes advantage of the differences between the swelling rate or dehydration rate of the material of the grooved and ungrooved surfaces, which causes the pasta/dough 20 to change shape. The grooves cause a difference in the speed of water swelling (or contracting) between the upper/top 22 and lower/bottom surfaces 24, more specifically, the side with grooves has a slower water swelling rate than the side without the grooves. Grooves also provide space into which each peak can expand in both directions, while the side without grooves can expand much larger and/or faster without any interruption. When the peaks on both sides of the groove are close enough during the swelling process, the two peaks tend to stick together under the gelatinization of dough 20, which serves to maintain the transformed shape. FIG. 31B shows the shape transformation of fusilli lunghi pasta (i.e., long spirals) before and after cooking. As the grooves collide, the released amylopectin causes them to adhere to each other. For both hydration 52 and dehydration 54, the maximum bending angle 42 increases as the groove width decreases.

Figure 35:
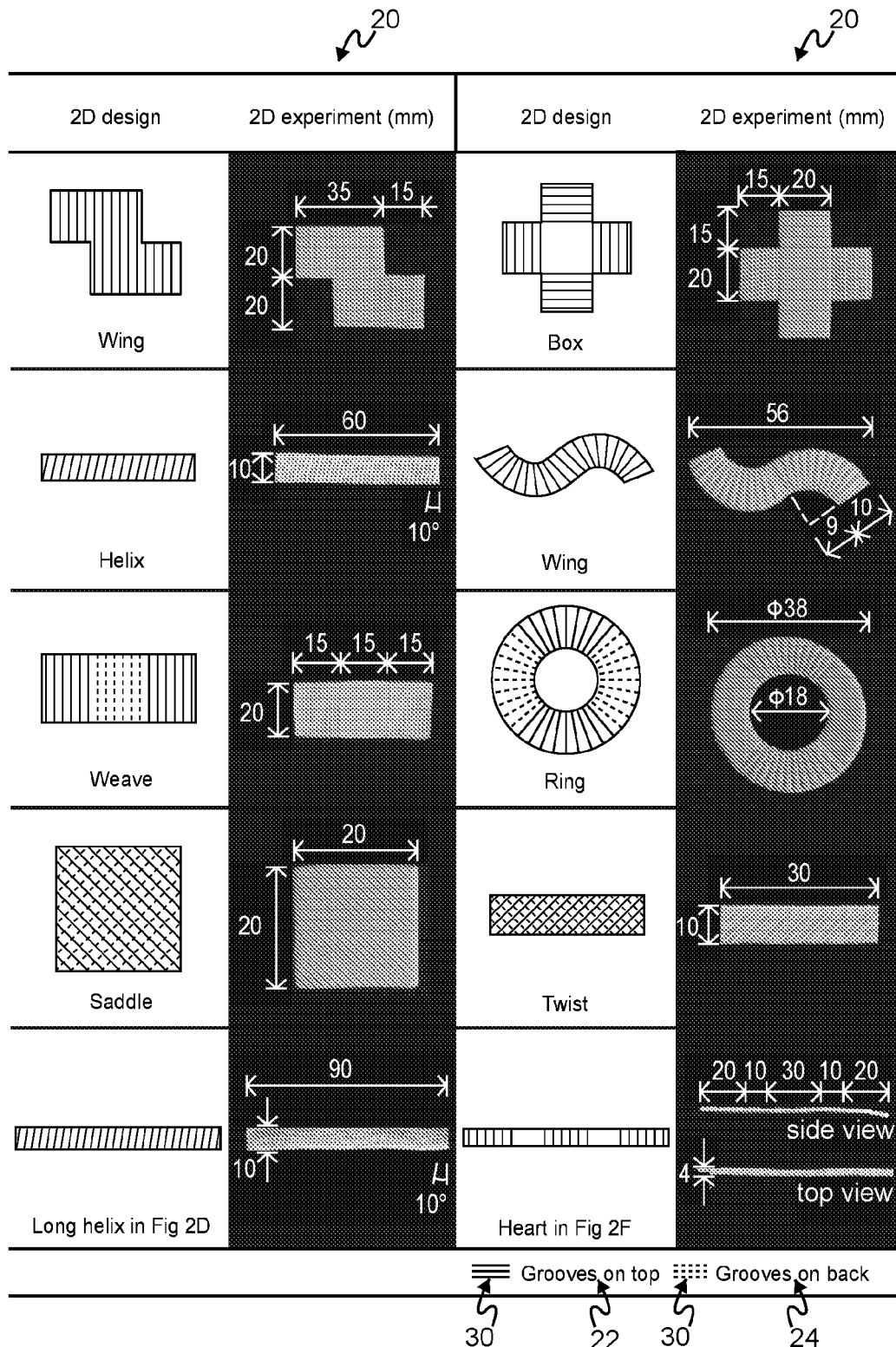
FIG. 35 is a chart of various morphing pasta samples showing a design schematic and a photograph of the corresponding flat sample.

For many of the desired final shapes 44 for shape-changing food 10 illustrated in the figures associated with this application, the individual grooves in a set of grooves 30 are parallel to one another. However, the present invention does not require that the individual grooves in a set of grooves 30 be parallel to one another. The bending angle associated with an individual groove will be perpendicular to the longitudinal direction of the groove. The resulting or total bending angle or final shape 44 of a shape-changing food 10 will be the accumulation of the curvatures at each local point that is grooved on the dough 20. FIG. 35 illustrates non-parallel grooves in the "Wing" shape and the "Ring" shape 2D designs. FIG. 35 also shows the corresponding photographs of dough 20 imprinted with those two non-parallel sets of grooves 30 designs. Similarly, given that the bending angle associated with an individual groove will be perpendicular to the longitudinal direction of the groove, bending of flour-based doughs or other materials can be achieved by the use of even one groove, instead of a set of grooves 30.

Figure 12A:
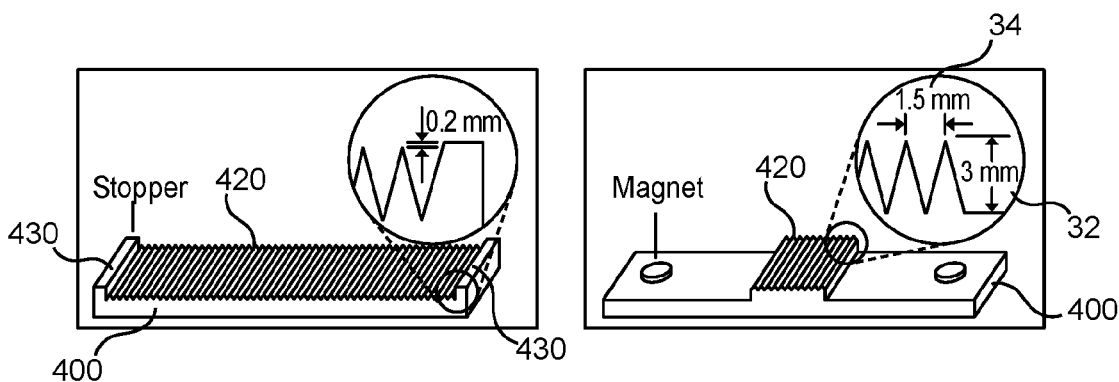
FIGS. 12A and 12B are two possible embodiments of a grooving mold according to the present invention.
Figure 12B:
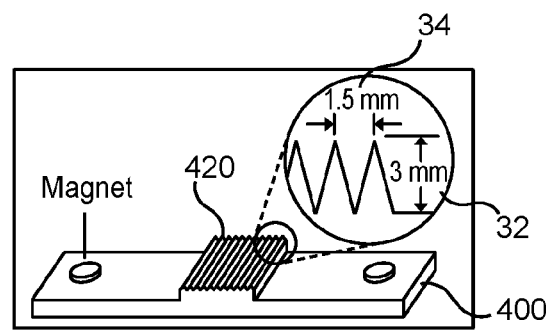
Figure 36:
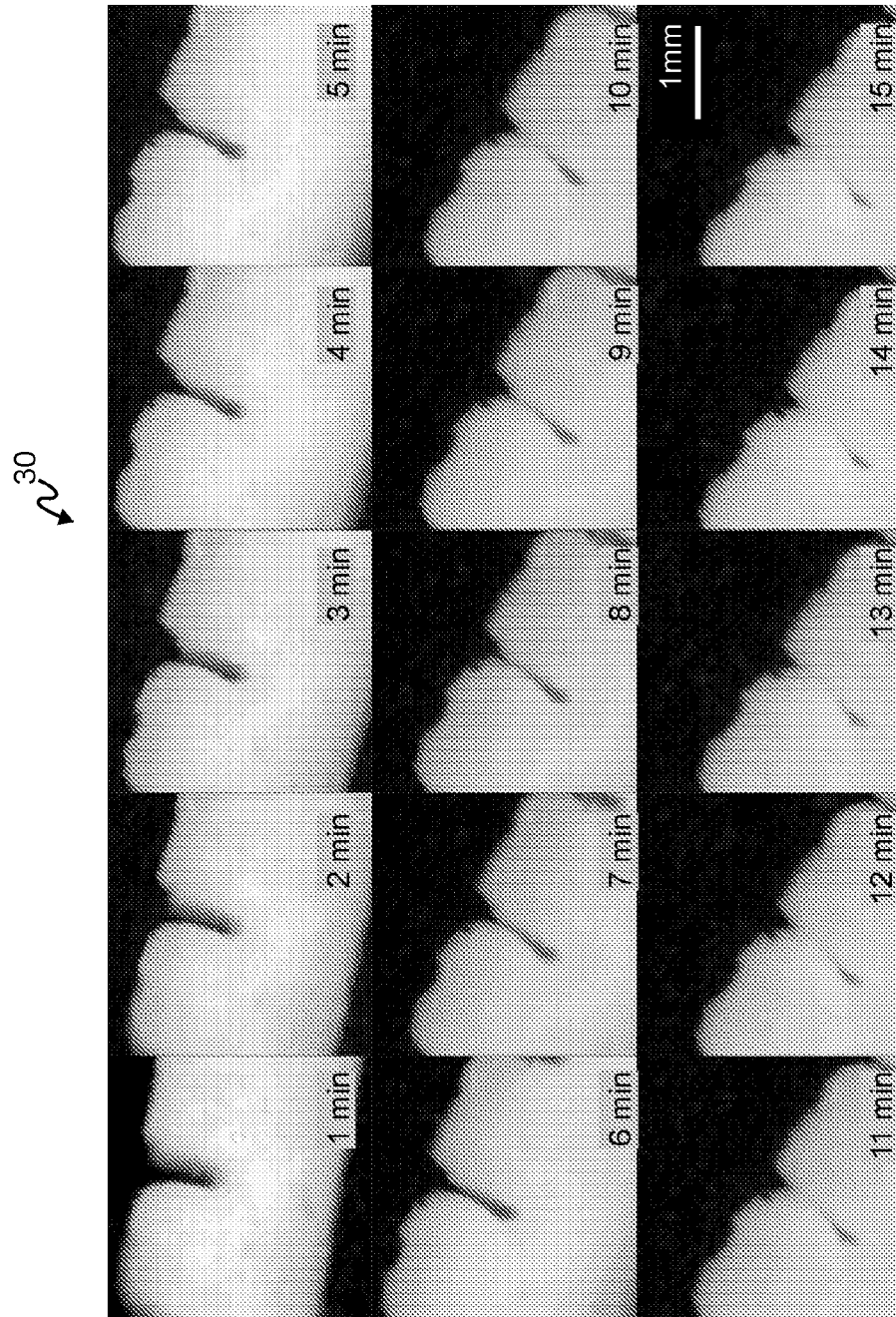
FIG. 36 are close-up images of the gaps or grooves over time.

For flour dough 20, the morphing is irreversible. Pasta samples in FIGS. 34A through 34D reached their maximum bending curvature between 10 to 20 minutes and remained three dimensional until the samples were overcooked and disintegrated. After 2 hours of continuous hydration 52 in 90° C., the bending curvature only had a 20% decrease. This irreversible shape assembly and shape-locking is due to amylopectin that leaks out of starch from the flour during cooking (FIG. 31B) as a natural glue to partially fuse the colliding grooves (FIG. 31B and FIG. 36) and the irreversible gluten denaturation and starch gelatinization. To maximize the bending curvature, the viscoelasticity of the dough 20 was utilized to produce quadrilateral frustum shaped grooves with a stamping mold 400 that has cuboid shaped extrusions (FIGS. 12A, 12B and 31A). Additionally, the design leveraged the irreversible morphing phenomenon of flour dough 20 for shape locking (FIG. 36).

Overview of Dehydration Stimuli: The present invention encompasses a similar process via dehydration 54. In the drying process, the same bending orientation performance takes place as the swelling process (FIG. 5B) occurs. However, in the case of dehydration 54, which has a longer deformation duration, the difference in the shrinkage rate between the side with and without grooves caused by the rate of thermal diffusion propagation is not the only reason for the change in the dough's shape. The side with grooves has a larger surface area which causes a higher shrinkage rate, while the surface without grooves has a smaller surface area which means a lower shrinkage rate. Additionally, higher temperatures can enhance the deformation effect, which brings additional value to the creation of a baking method for self-warping food 10.

Figure 27:
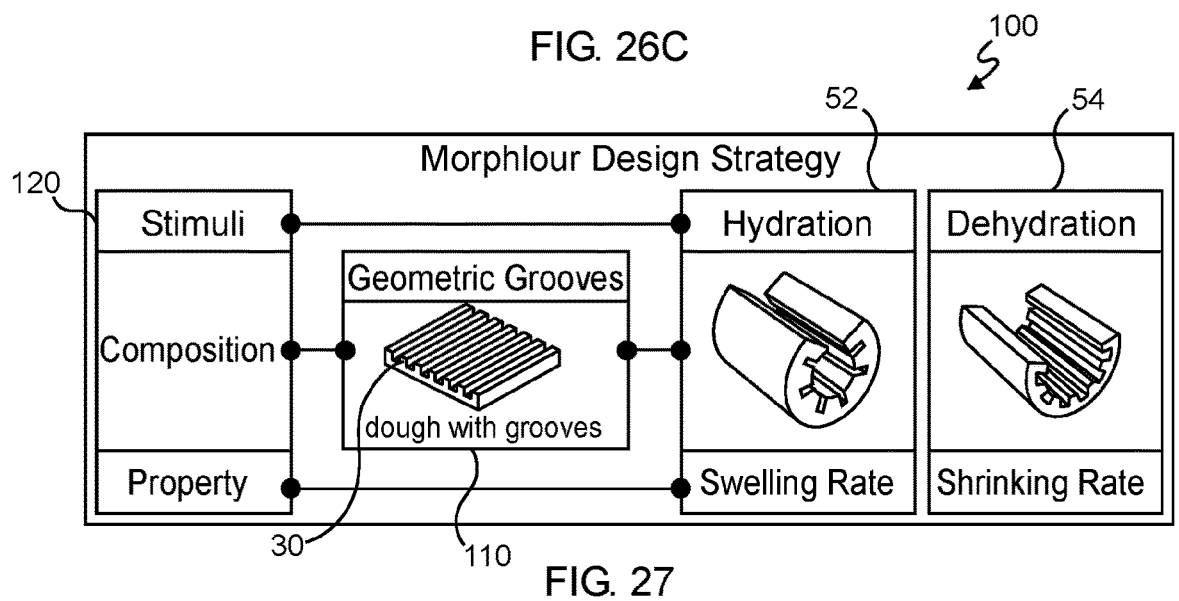
FIG. 27 illustrates the present invention's design strategy for creating flour-based morphing food induced by dehydration or hydration stimuli.
Figure 37:
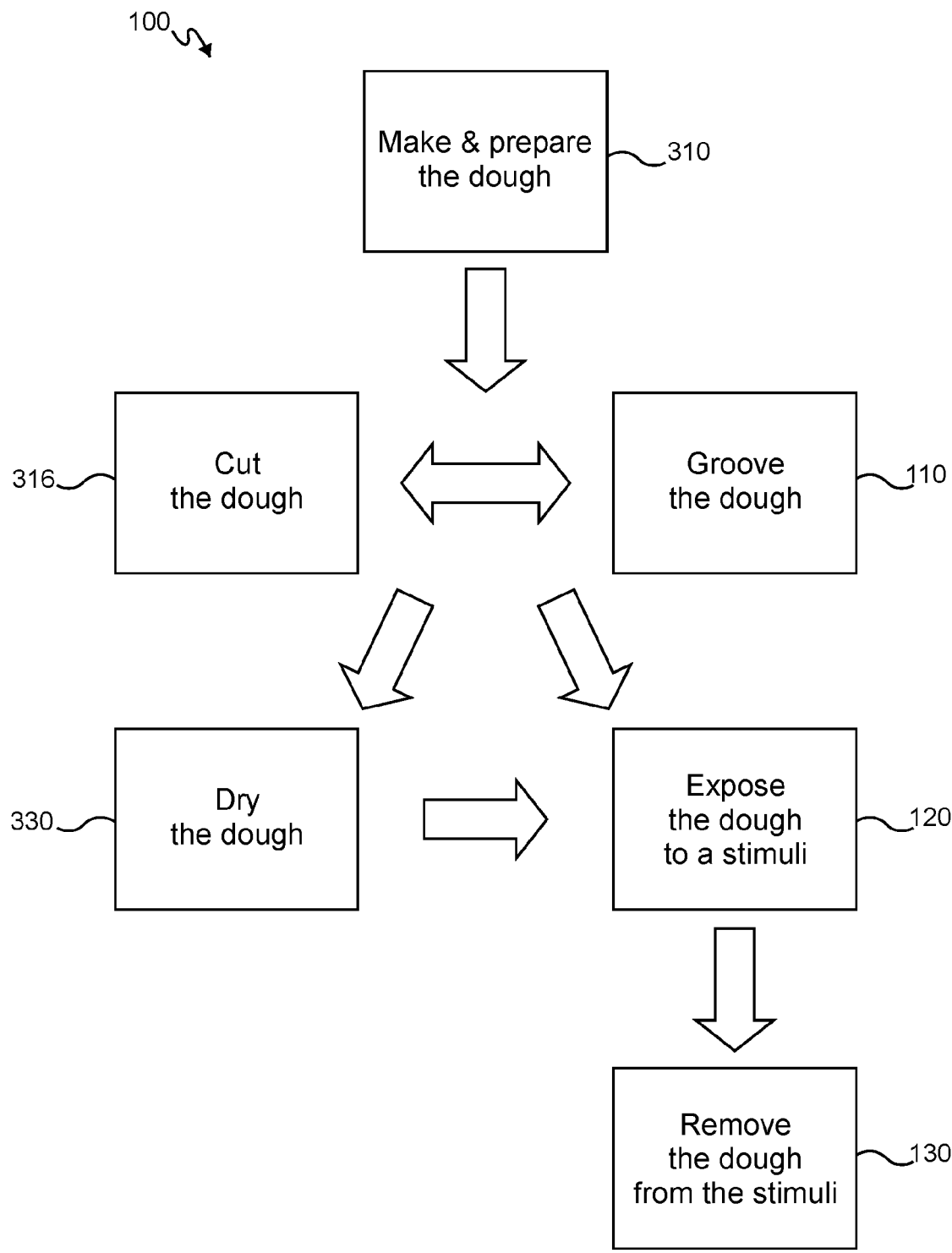
FIG. 37 is a flowchart of a method of making shape-changing food according to the present invention.

Computational Design and Fabrication—Parameterized Material Performances: The present invention's groove-induced shape-changing method 100 is effective for morphing flour-based food shapes. This is a novel method 100 to induce a shape-changing effect during both the hydration 52 and dehydration 54 processes, which involves modifying 110 the surface texture of the dough 20 and then exposing 120 the dough 20 to a transformational mechanism (such as a stimuli 50) to induce a shape changing behavior. The method 100 for creating shape-changing food 10, broadly diagramed in FIG. 37, involves grooving 110 at least one set of parallel grooves 30 onto a flour-based dough 20, having a top surface 22 and a bottom surface 24, at an angle perpendicular to a predetermined bending angle 42 and at a groove spacing 34 and groove depth 32 chosen to result in a predetermined final shape 44 or the predetermined bending angle 42 and then exposing 120 the flour-based dough 20 a stimuli 50 to cause the prepared flour-based dough 20 to change shape. As illustrated in FIG. 37, once the dough 20 is prepared it is then cut and/or grooved. The cutting 316 and grooving 110 steps are interchangeable in terms of the order in which they occur. Drying 330 the cut and grooved dough 20 is an optional step for those instances when the dough 20 is not going to be cooked immediately. Then, as shown in FIG. 37, the cut and grooved dough 20 is exposed 120 to a stimuli 50 and then removed from the stimuli 130, 50 when the ultimate bending angle 42 or shape 44 is achieved. When preparing shape-changing food 10 by boiling or baking, the dough 20 is then removed 130 from the stimuli 50 (boiling or baking) when it is finished being cooked and/or when the predetermined final shape 44 or the predetermined bending angle 42 has been achieved As illustrated in FIG. 27, one embodiment of the design strategy implementing this method 100 involves creating flour-based morphing food 10 that is induced by dehydration 54 or hydration stimuli 50.

To integrate the method 100 into the present invention's computational design tool 200, design variables need to be parameterized. In the following discussion of experiments, certain design variables are described that can control the maximum, predetermined or desired bending angle 42 and the bending orientation(s) 40 of the sheeted dough 20. These variables are integrated into a design tool 200 according to the present invention.

The experiments used plain dough 20, egg white dough 20 and oat fiber dough 20. The plain dough 20 was made with 112 g semolina flour and 43 g water. The egg white dough 20 contained 112 g flour, 9 g egg white, and 43 g water. The oat fiber dough 20 contained 112 g flour, 42 g oat fiber, and 125 g water. However, it will be obvious to one skilled in the art that the exact composition of the dough 20 used with the present invention can vary by type of flour (wheat, corn, rice, spelt, garbanzo, semolina, white, bread, pizza, pasta, cake, etc.) and type of liquid (water, egg, egg yolk, milk, juice, broth, etc.), the inclusion of other ingredients including but not limited to eggs, egg whites, salt, sugar, colorings, flavorings, etc., and the ratio of dry ingredient(s) to wet ingredient(s).

For the described experiments, the sample size (or initial shape 26 and initial size 28) was 50 mm in length, 15 mm in width, and 2 mm in thickness. The mold 400 that was used to groove had a pitch distance of 1.5 mm. It will be obvious to one skilled in the art that other flour-based dough recipes will work with and are included in the present invention. Additionally, as explained more fully herein, it will be obvious to one skilled in the art that molds 400 having different pitch distances and groove depths 32 will accomplish different folding effects and all such variations of pitch distance (or groove spacing 34) and groove depth 32 are included within the scope of this invention.

Figure 4A:
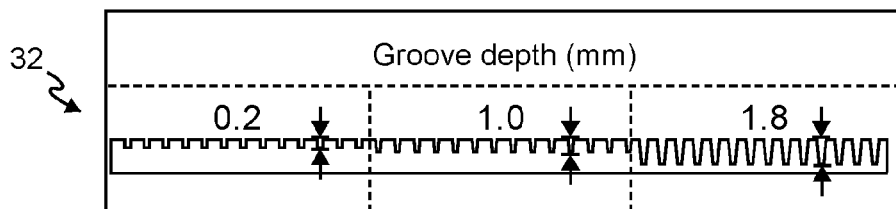
FIGS. 4A through 4D illustrate how groove depth affects the bending angle.
Figure 4B:
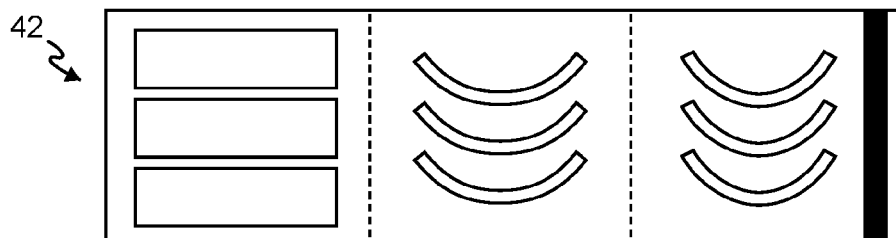
Figure 4C:
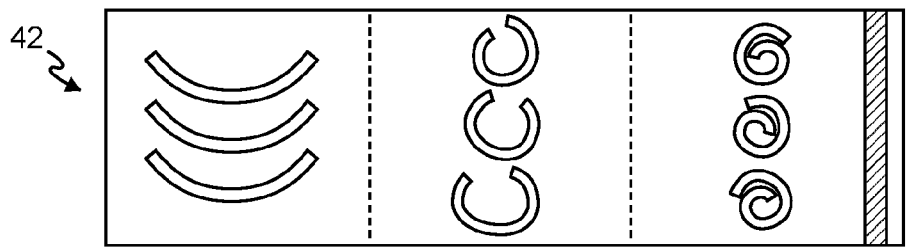
Figure 4D:
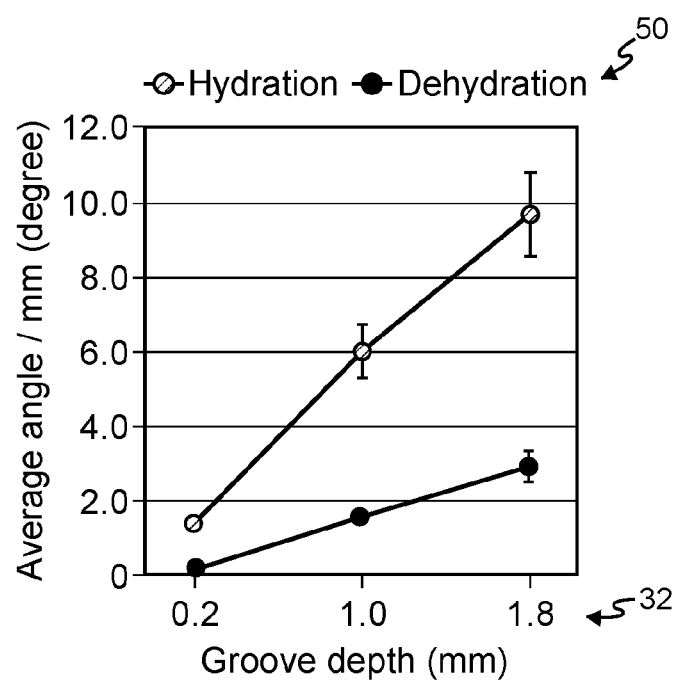

Groove depth 32 is an effective control parameter to determine the maximum bending angle 42 of the sheeted dough 20. FIGS. 4A through 4D show that for the three chosen groove depths 32, the deeper the groove depth 32 is, the bigger the maximum bending angle 42 is. FIG. 4A shows the groove depth 32 of different samples made with the same mold 400. FIGS. 4B through 4D illustrate maximum bending angles 42 of the samples during dehydration 54 (FIG. 4B), hydration 52 (FIG. 4C) and the groove depth 32 to average maximum bending angles 42 per unit length (FIG. 4D). For the same samples, the average maximum bending angle 42 is bigger during the hydration process 52 than the dehydration process 54. The results shown in FIG. 4 were achieved using plain dough 20, made according to the previously-described recipe for the experiment.

Groove direction 36 determines the bending orientations. As FIG. 5 shows, during both dehydration 54 and hydration processes 52, the samples bend perpendicular to the directions of the parallel grooves 30. For this experiment, the groove depth 32 was 1.8 mm and plain dough 20 was used. FIG. 5A shows parallel grooves 30 with varied angles to the edge of the rectangular sample. FIGS. 5B and 5C show how the varied angles bend along the direction of the grooves. These experiments showed that, for this particular composition of dough 20, the preferred parameters are a groove depth 32 of about 1.8 mm, an initial dough thickness of about 2 mm, and a groove spacing 34 of about 1.5 mm. However, it will be obvious to one skilled in the art that the groove depth 32, the groove direction 36, the groove spacing 34, the groove density, the groove direction 36, the pitch distance, the dough composition and the initial dough thickness, size and shape can be varied to achieve any desired or predetermined bending angle 42, desired or predetermined bending direction 40 and desired or predetermined final shape 44, and all such combinations are included within the scope of this application. As demonstrated by the research explained herein, these factors are all interrelated and varying any one of the factors impacts the bending direction 40, the bending angle 42 and the final shape 44. Therefore, this application encompasses all variations and combinations of these factors to achieve any desired or predetermined bending direction 40, the bending angle 42 and/or the final shape 44.

Figure 24A:
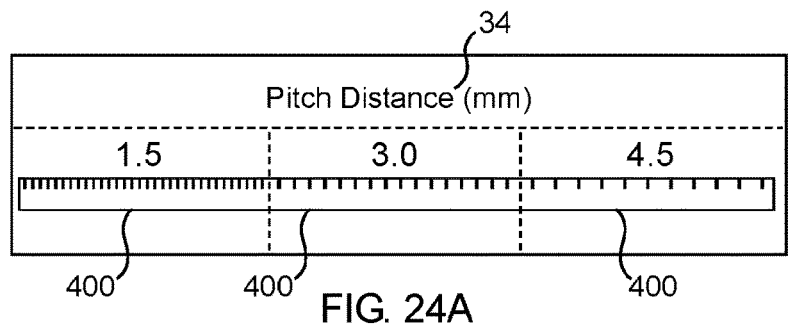
FIGS. 24A through 24D illustrate how the bending angle changes with groove density according to the present invention.
Figure 24B:
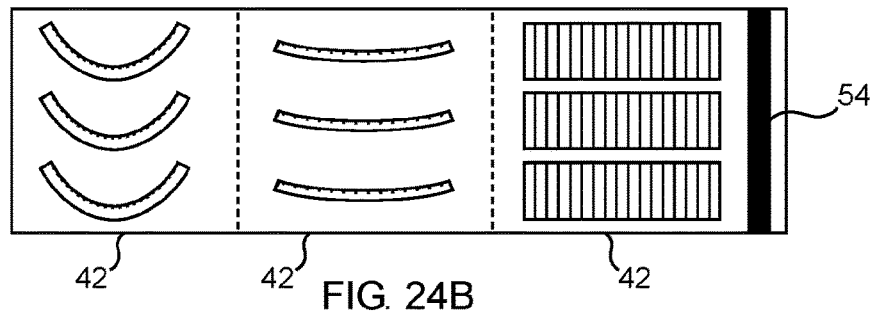
Figure 24C:
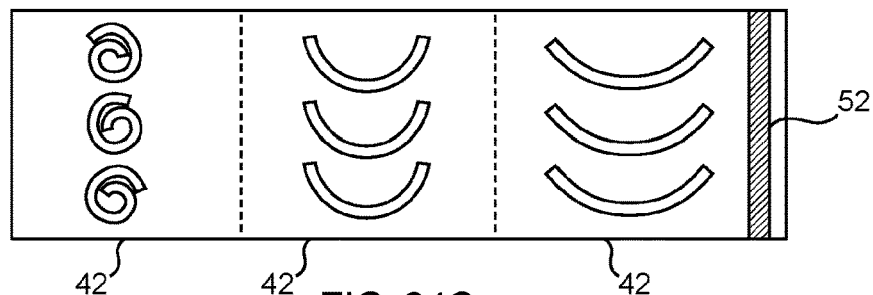
Figure 24D:
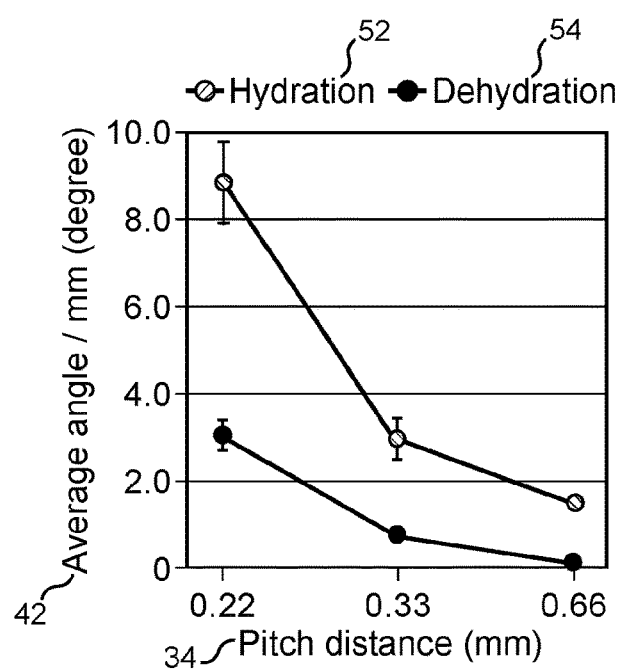
Figure 34A:
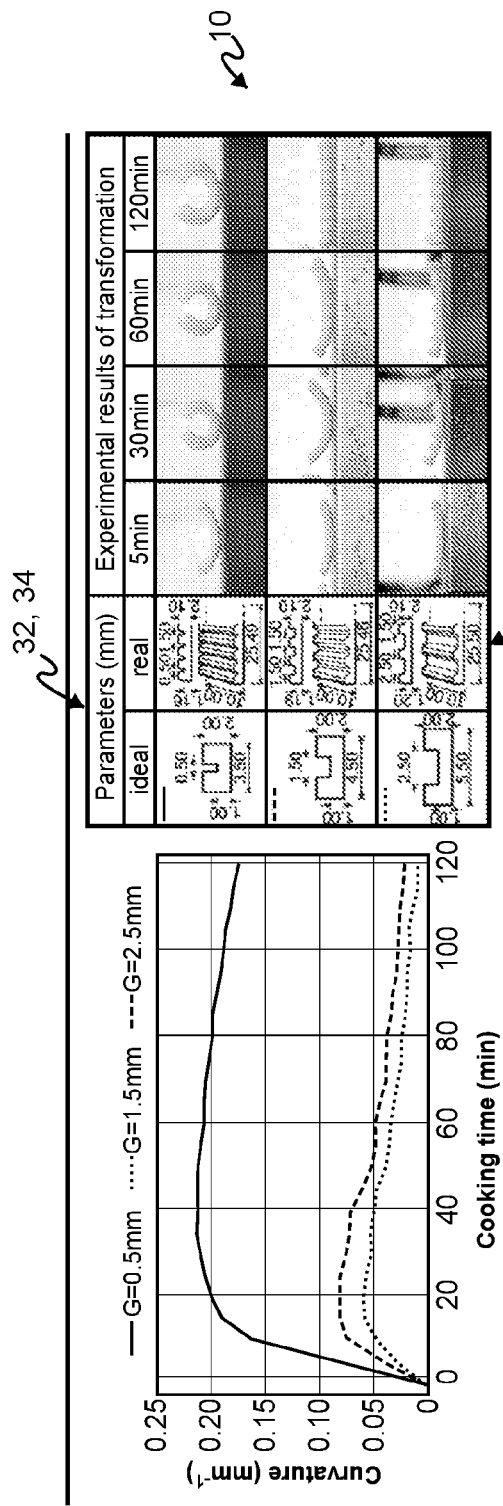
FIGS. 34A through 34D show the experimental results on geometrical parameters of morphing pasta.
Figure 34B:
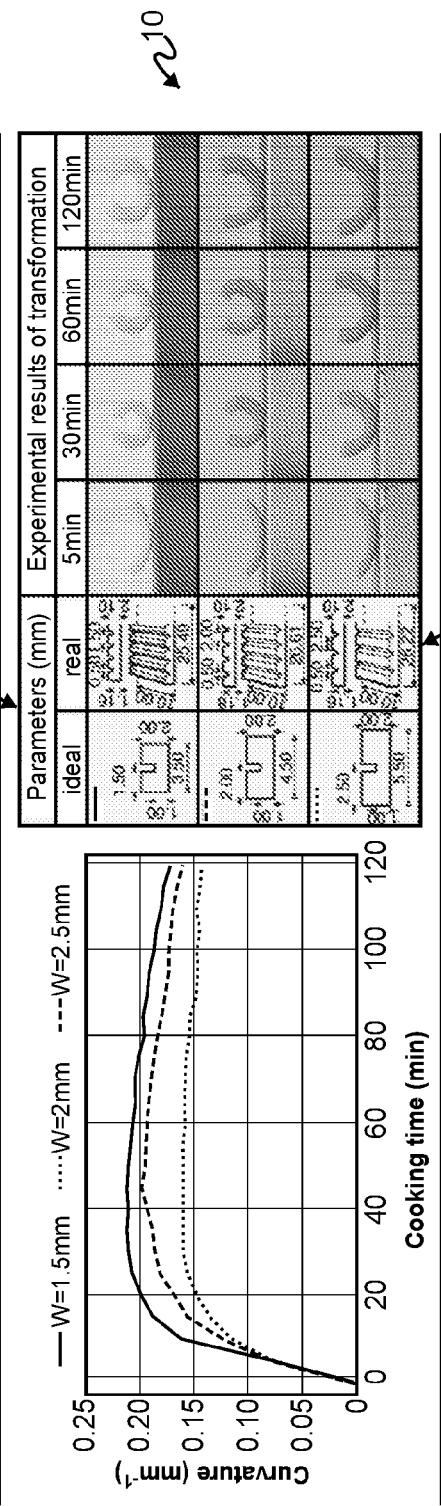
Figure 34C:
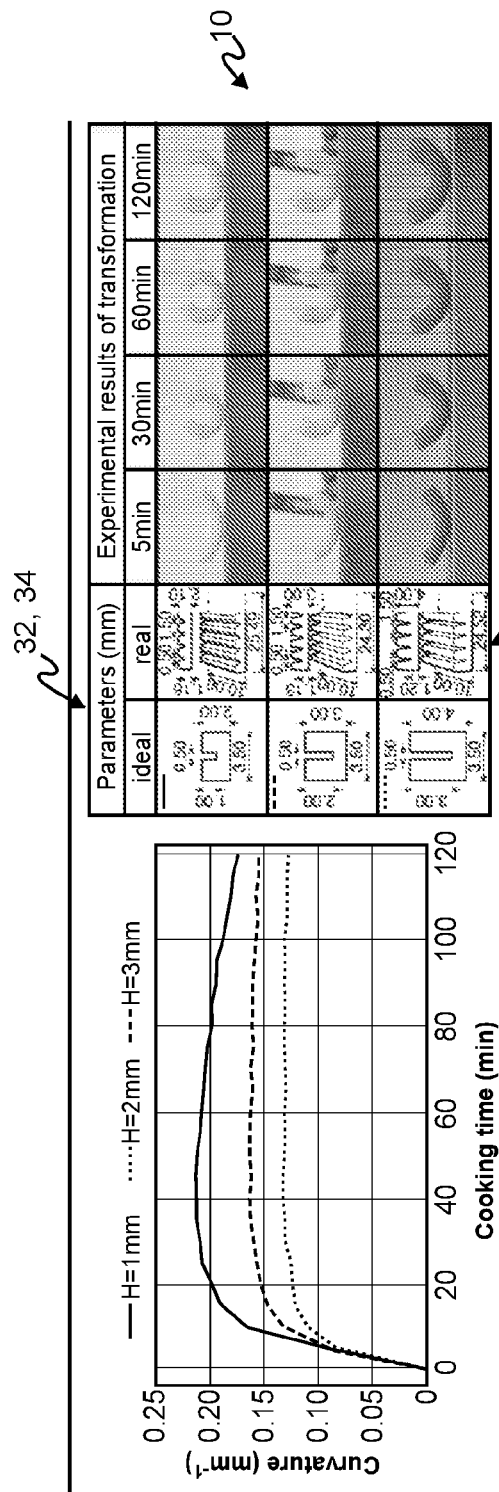
Figure 34D:
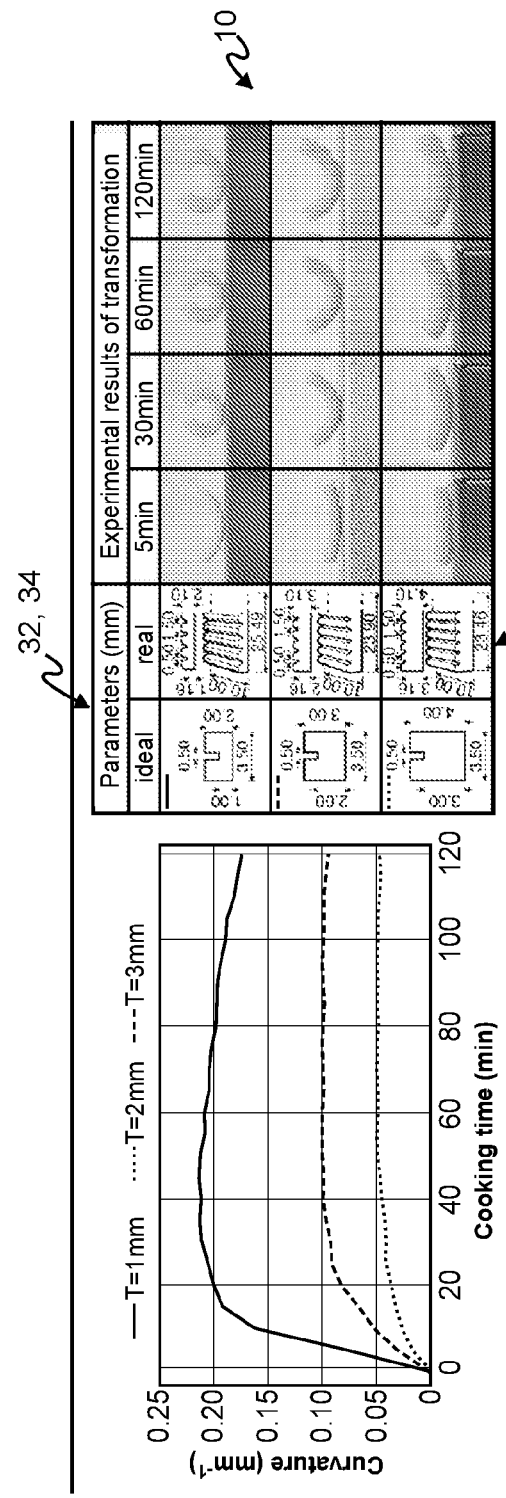

While groove depth 32 is one of the most important factors in determining dough bending, groove density, groove distance and/or pitch distance also are factors that help to determine dough 20 bending and shape. FIGS. 24A through 24D illustrate the effect of various groove densities on bending. As shown in FIG. 24D, a pitch distance of 1.5 mm displays the best bending performance for both hydration 52 and dehydration 54 processes for the dough 20 tested under the conditions described herein. Therefore, most of the research conducted and explained herein utilizes grooves with 1.5 mm pitch distance. FIGS. 24A through 24D also demonstrates how the pitch distance and density can be varied to achieve more or less bending depending upon the desired or predetermined bending outcome for any given application of the present invention. Various manufacturing devices and techniques can be used to achieve greater or lesser pitch distances. FIGS. 34A through 34D also demonstrate the results of four of these factors on the morphing pasta. Pasta strips have different bending performance with varied groove width (FIG. 34A), groove gap (FIG. 34B), groove depth 32 (FIG. 34C) and base thickness (FIG. 34D).

Another factor described more fully herein is the impact of using single-sided or double-sided grooving patterns. Both positive and negative gaussian curvatures are achieved with either single sided or double sided grooving patterns (shown in FIG. 35). FIG. 35 illustrates various morphing pasta samples as a design schematic and as a flat sample. The thickness of the samples shown in FIG. 35 is 2 mm.

Figure 6A:
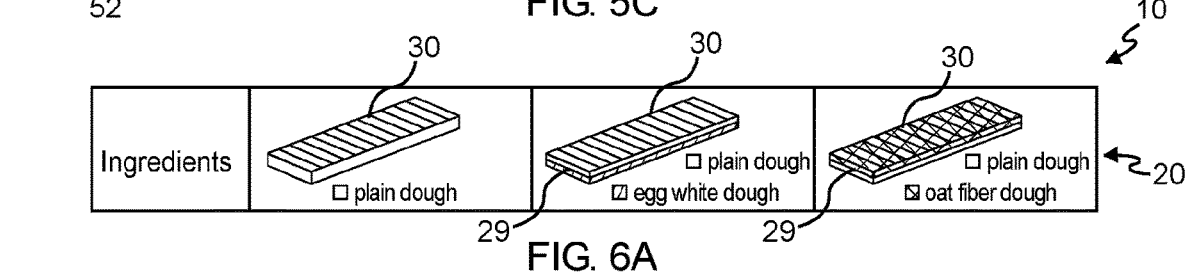
FIGS. 6A through 6C illustrate the impact of a bi-layer composite structure on bending curvature.
Figure 6B:
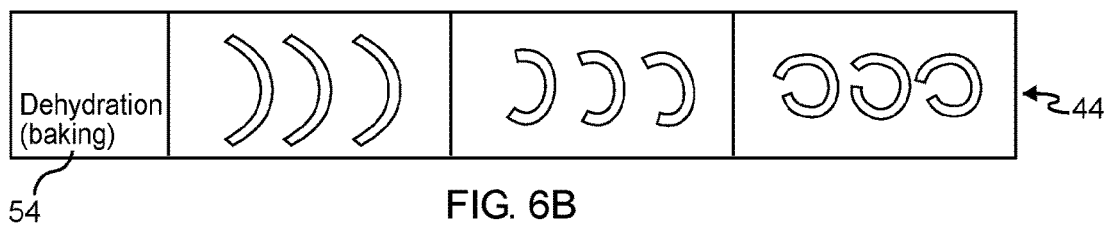
Figure 6C:
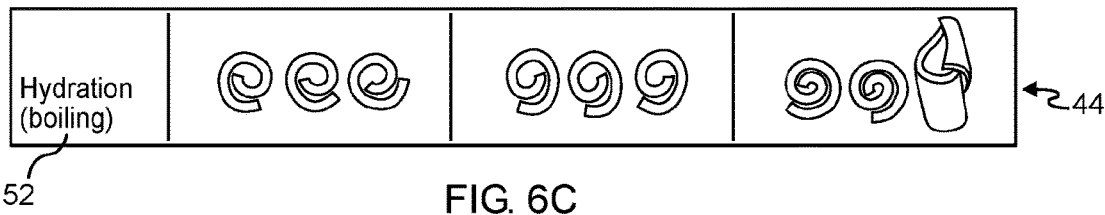

Research on the present invention explored optimization of the maximum bending angle 42 by introducing a bi-layer 29 material composition in conjunction with the groove effect. FIGS. 6A through 6C show that by forming either flour and flour-egg white bi-layer 29 (egg white dough 20), or flour and flour-oat fiber bi-layer 29 (oat fiber dough 20), the maximum bending angle 42 can be further increased. For this experiment, the groove depth 32 was 1.8 mm.

In this experiment, egg white was chosen for its ability to harden when cooked due to the denaturation of its proteins at high temperature. As a result, the cooked egg white dough 20 has a smaller swelling rate than plain dough 20. In contrast, oat fiber dough 20 has a higher swelling rate than the plain dough 20.

Layer thickness is another variable. As FIG. 25 shows, during the hydration process 52, the sheet with a layer thickness at around 2 mm achieves the best shape retention after the sheet is taken out of water and the most significant or drastic bending angle 42 when the sheet is still in water. For this reason, the experiments conducted and described herein utilize 2 mm as the sheet thickness, but other thickness can be used and are included within the scope this application.

Different bilayer 29 thickness ratios were tested as another variable, whereby it was determined that a 1:1 layer 29 thickness ratio for egg white dough 20 and oat fiber dough 20 behaves the best for the dough composition being used in these experiments. Thus, a 1:1 ratio applies to all bilayer experiments discussed below unless noted otherwise.

Figure 38:
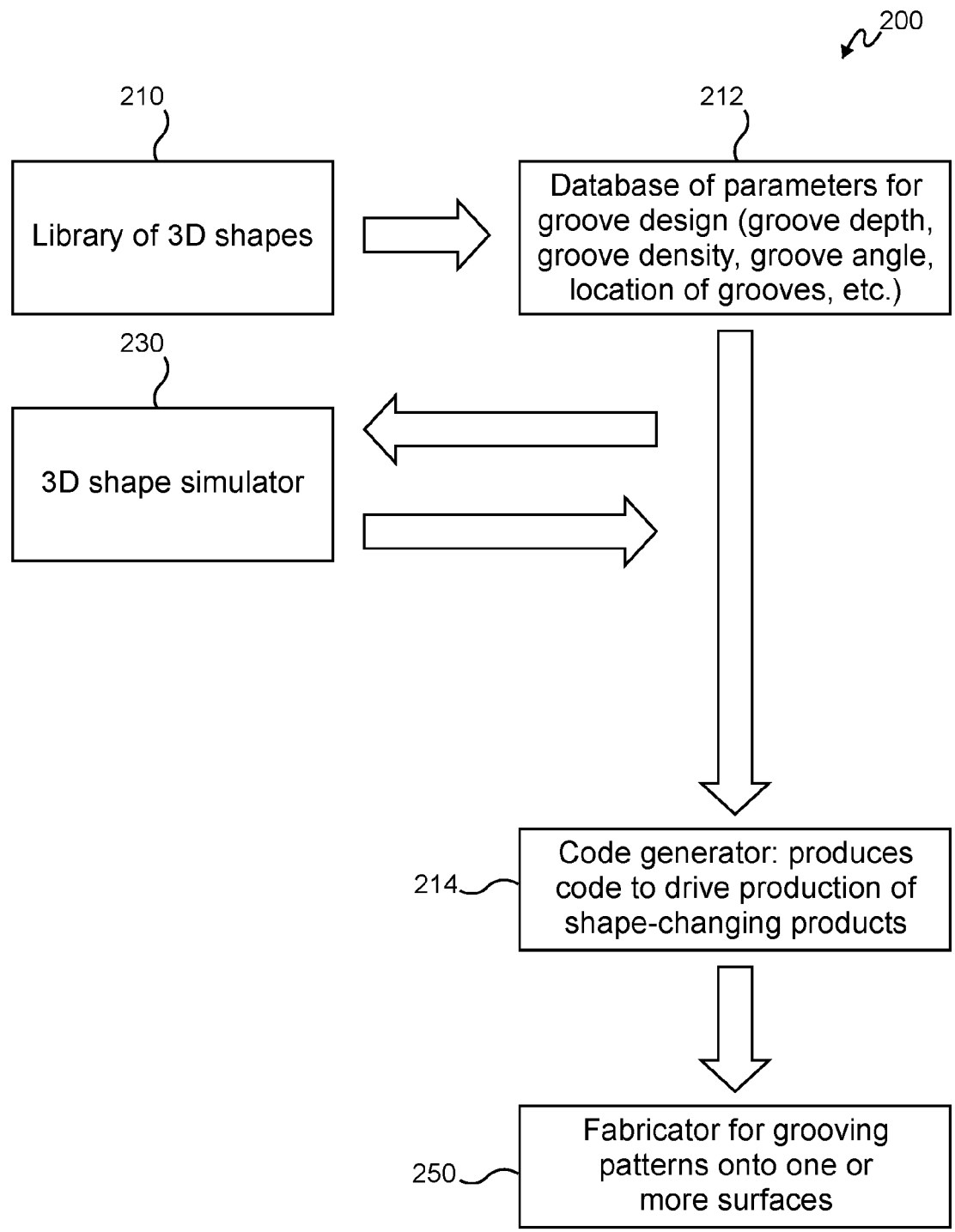
FIG. 38 is a flowchart of one embodiment of the computation design tool of the present invention.
Figure 39:
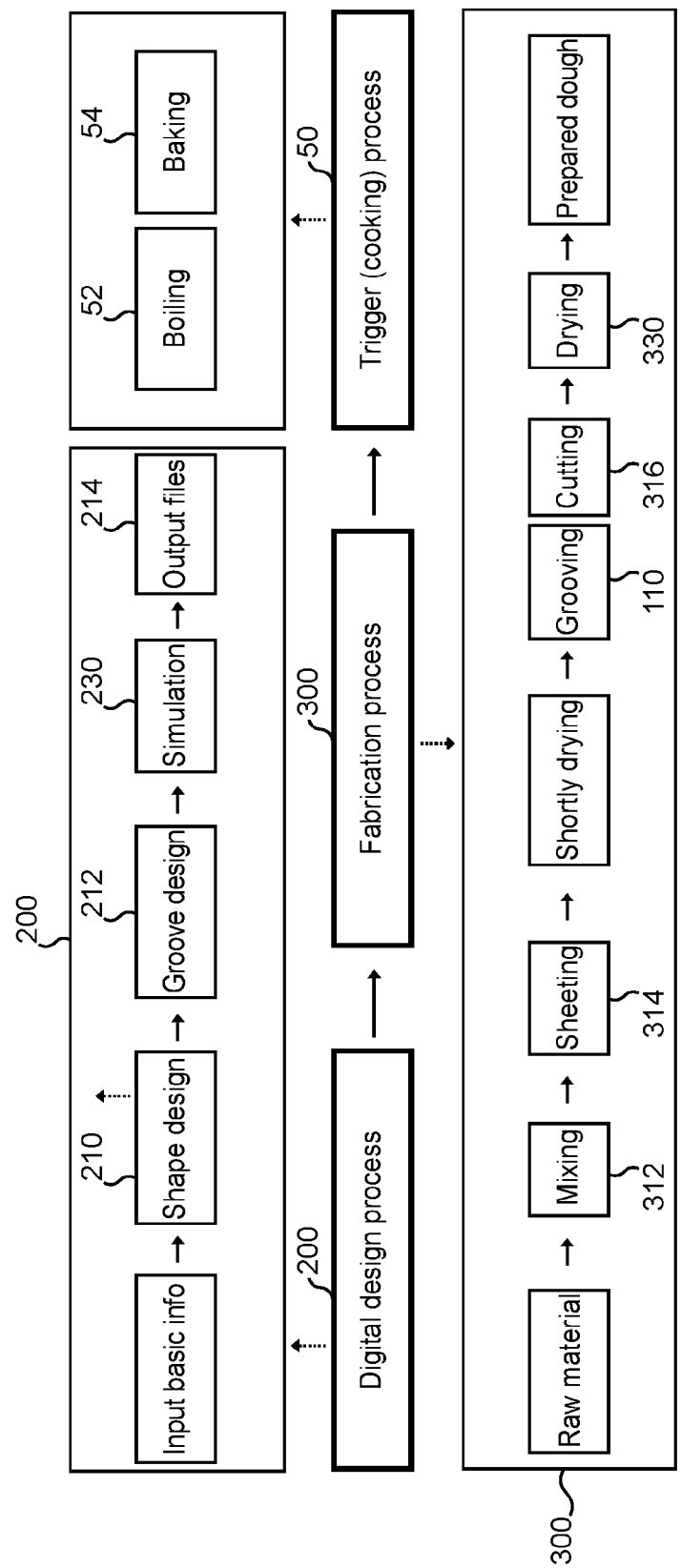
FIG. 39 is a flowchart showing the interaction of the digital design process, fabrication process and cooking process for one embodiment of the present invention.
Figure 40:
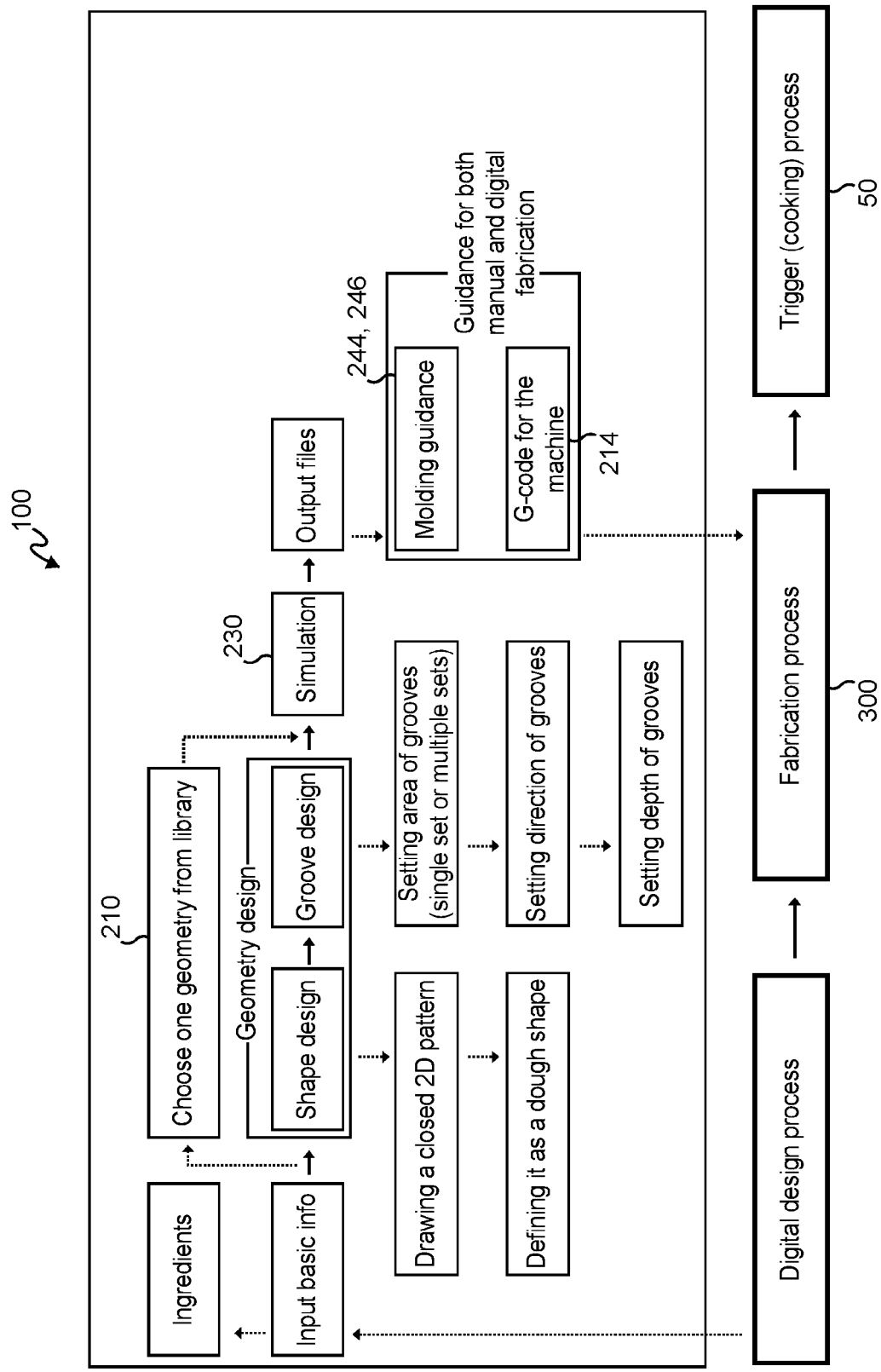
FIG. 40 is a flowchart of one way in which a computational design tool of the present invention can interact with the digital design process and the fabrication process.

Computational Design Tool 200: One embodiment of the present invention is a computational design tool 200 that integrates design parameters and cooking guides to help users easily design and simulate shape-changing food 10 (broadly shown in FIGS. 7A through 7E and diagramed in FIGS. 38, 39 and 40). More specifically, the design tool 200 implements the present invention's method 100 with a multi-step design flow, which steps can be displayed and controlled by an optional user interface. One embodiment of the computational design tool 200 has a 3D shape library 210 comprised of at least one 3D shape for flour-based foods 10, from which library 210 the dough shape and/or the predetermined final shape 44 is defined or selected (FIGS. 7A, 39 and 40). This computational design tool 200 also has database 212 containing information on grooves and grooving parameters that correlates to each of the at least one 3D shapes for flour-based foods 10 (FIGS. 38 and 40). From this database 212 the area of grooves and the grooving 110 parameters are set 220 (FIGS. 7B and 40). This embodiment of the computational design tool 200 also has a code generator 214 to produce code for production of the 3D shaped flour-based foods 10. G-code or other similar code is generated 240 to control the machine(s) (FIGS. 7D, 38, 39 and 40).

Another embodiment of a computation design tool 200 comprises an additional element of a simulator to simulate the 3D shapes (FIGS. 7C, 38, 39 and 40). A further element of some embodiments of the computation design tool 200 is a fabricator to groove patterns onto a flour-based dough 20. Finally, FIG. 7E illustrates one possible embodiment of a user interface for selecting control parameters for shape selection. One embodiment of the tool 200 compiles G-code for machine operation. Additionally, the code generator 214 further can generate an ingredient list 242, dough preparation instructions 244, and/or cooking instructions 246 and this code is used to control at least one machine in a digital fabrication process 300. However, the design tool 200 is not limited to a particular code or machine language, and any code appropriate to the machine being used can be generated 240 and are included within the scope of this application.

One step or element of one embodiment of both the design tool 200 and the method 100 of the present invention involves determining the desired or predetermined final shape 44. For the computational design tool 200 of the present invention, the first step involves the user choosing the dough shape. The second step is defining the groove parameters 220. The third step is the design tool 200 simulating the final 3D shape 230 of the dough 20 after grooving 110 and exposure a stimuli 120, 50. The design tool 200 incorporates a shape library 210, such as the library 210 illustrated in FIG. 28, that correlates these three pieces of information (the initial dough shape, the grooving parameters, and the final dough shape). FIG. 28A shows a single set of grooves on a 2D sheet 215. FIG. 28B shows multiple sets of grooves on a 2D sheet 216. FIG. 28C shows multiple sets of grooves on a 1D line 217. Based upon tests of the dehydration 54 and hydration 52 cases, it is possible to utilize multiple shape designs, including a single set 215 or multiple sets of grooves on a 2D sheet 216 or 1D line 217, as shown in FIGS. 8A through 8C.

Figure 9:
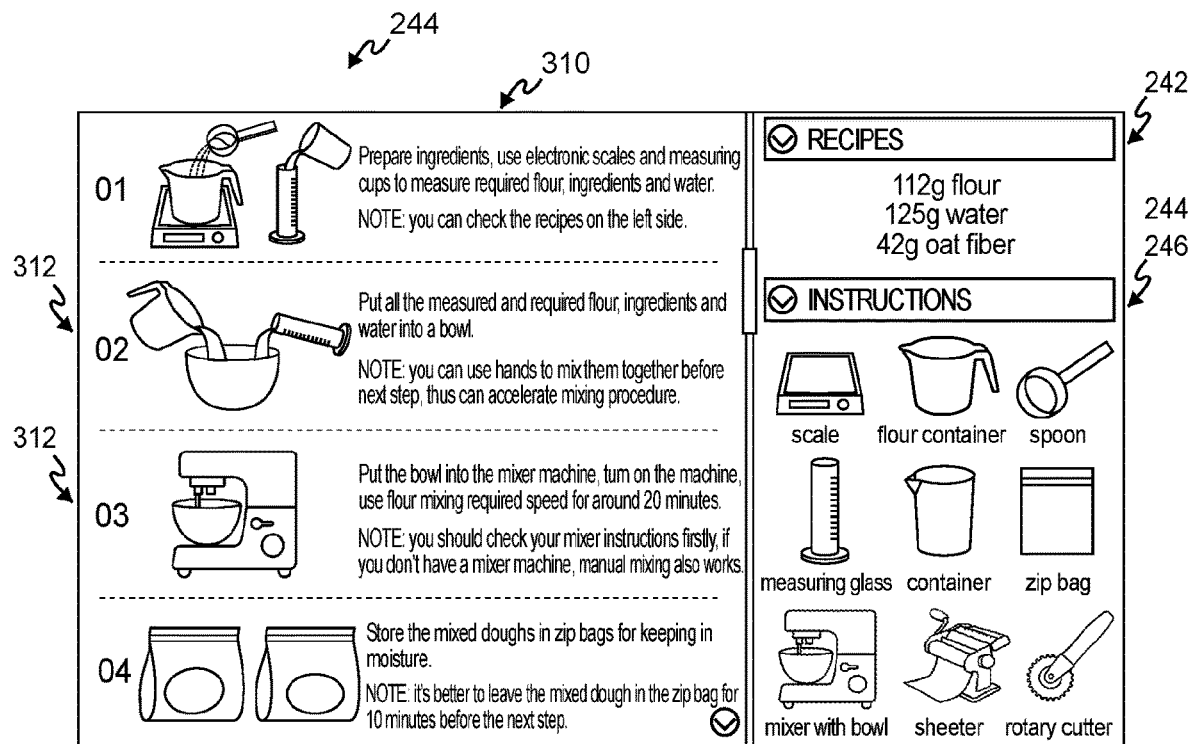
FIG. 9 illustrates one possible instruction process for one embodiment of a manufacturing process according to the present invention.

Second, some embodiments of both the computational design tool 200 and the method 100 can involve the utilization of fabrication instructions. Following the convention of a cooking recipe, one embodiment of the tool 200 generates instructions containing material ingredients 242 and illustrated manufacturing processes 244, 246, as shown in FIG. 9. FIG. 40 illustrates how these fabrication instructions can be fed into a fabrication process.

Figure 10A:
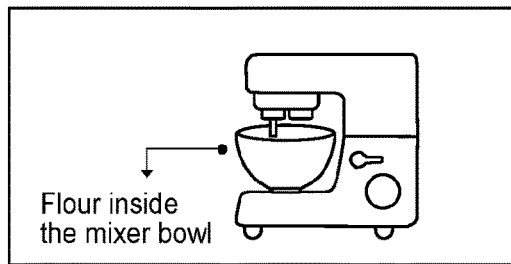
FIGS. 10A through 10D illustrate one possible dough preparation process according to one embodiment of the present invention.
Figure 10B:
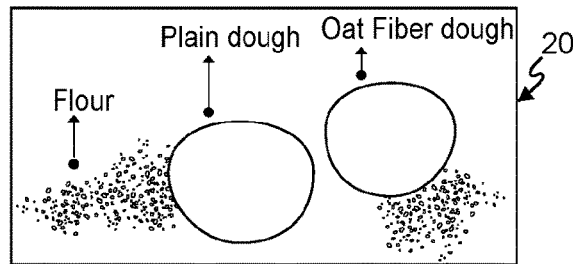
Figure 10C:
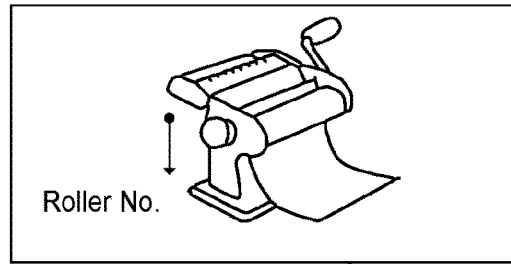
Figure 10D:
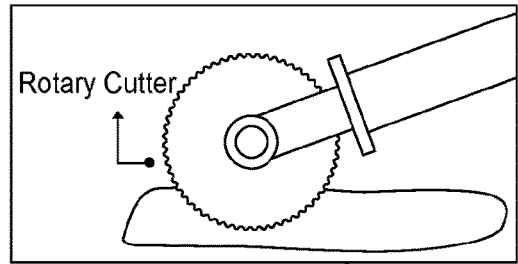

Third, one embodiment of the method 100 and the design tool 200 involves preparing the dough 310. This embodiment employs a manual or semi-manual process that is commonly used in traditional dough making. For one embodiment of the method 100, this process 310 includes three steps—mixing 312 (FIGS. 10A and 10B), sheeting 314 (FIG. 10C), and cutting 316 (FIG. 10D). For the design tool 200, the user can set ingredients before shape designing and the design tool 200 will generate the manual process guidance. First, all of the ingredients are placed in the bowl of a mixer at one time and mixed for 15 to 20 minutes. This step can be accomplished in a mixer capable of handling dough 20 or the dough 20 can be prepared by hand. When necessary, the dough 20 can be stored in a zipper bag or appropriate container to retain the dough's moisture until the sheeting process 314 begins. Second, for the sheeting process 314, a roller sheeter (any capable sheeting machine or hand rolling pin) can be used to sheet the dough 20 up to 150 mm wide with 10 optional thicknesses from 0.6 mm to 4.8 mm (defined by roller No. 0 to 9 on the Marcato Atlas 150 Pasta Machine used for this research). Most of the experimental samples were 2 mm in thickness, which can be sheeted sequentially at thickness setting No. 0 for one time, No. 2 for one time, and No. 3 for three times. However, there are numerous known ways of sheeting 314 pasta that vary depending upon whether the sheeting 314 is done by hand, on a kitchen pasta maker or in a commercial-production setting. All such methods are included within the scope of this invention.

For the bi-layer 29 structures, two separately sheeted doughs 20 can be prepared, stacked and sheeted, using any of the previously mentioned processes. Doughs 20 that utilize more than two layers 29 can be prepared using a similar method. Finally, the dough 20 is cut into to an initial size 28 and initial shape 26. It will be obvious to one skilled in the art that there are numerous automated and manual processes that can be used to prepare dough 20 for the present invention, and all such methods are included in the present application.

Figure 29:
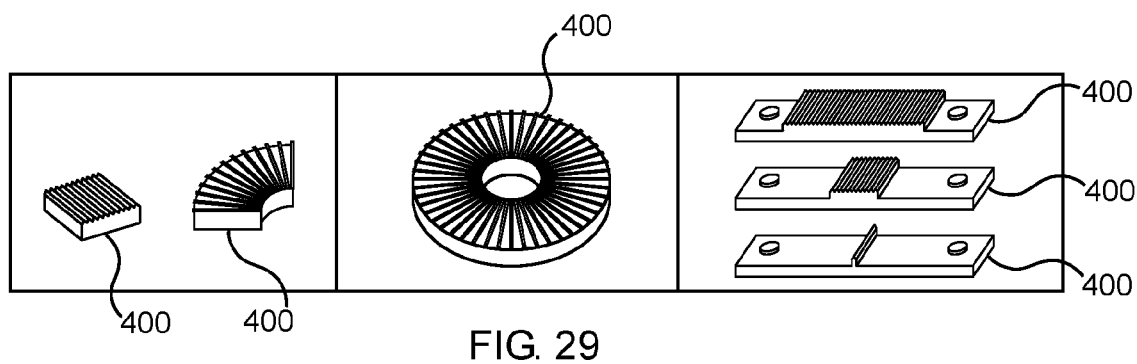
FIG. 29 shows examples of 3D printed customized molds according to one embodiment of the present invention.

Grooving 110 is the third step in dough preparation. Different from common and existing dough processing steps, grooving 110 is a unique element of the present invention. Many embodiments of the present invention include pressing a customized mold 400 into the sheeted dough 20 to produce grooves, so that the dough 20 exhibits shape-changing behavior. Some examples of customized molds 400 are shown in FIGS. 12 and 29. One embodiment of a mold 400 has a base 410 that connects the mold 400 to a grooving machine. Another embodiment of a mold 400 has a base 410 designed for hand-held use. Each of these molds 400 also has a grooving surface 420 designed to impart grooves of a desired groove depth 32 and groove spacing 34 onto the top surface 22 and, optionally, the bottom surface 24 of the dough 20. For different embodiments the base 410 and the grooving surface 420 can be made from a single piece of material or they can be different pieces of the same or different materials that are connected by any appropriate means known in the art. FIG. 12A shows a grooving mold 400 with stoppers 430 for use with a manual process. FIG. 12B shows a grooving mold 400 with magnetic connections for use with a digital fabrication process 300 of one embodiment of the present invention. FIG. 29 shows variable molds 400 for shape customizability. However, the manual grooving method 110 has limited accuracy and repeatability. Therefore, another embodiment of the present invention comprises fabricating the groove patterns 250 with corresponding shape-changing motions with digital fabrication methods 300. For the production of food, the grooving surface 420 should be made of an appropriate food-safe material. Additionally, the quality of the grooves and tips on the mold 400 impact the quality and character of the grooves made on the dough 20. A mold 400 with sharp inverted V-shaped tips was used for the experiments described herein.

The present invention also encompasses a digital fabrication process 300 for creating shape-changing flour-based dough 20. Similar to the method 100 and computational design tool 200, the digital fabrication process 300 includes the steps of: (i) mixing 312 at least a flour and a liquid together to create a flour-based dough 20; (ii) sheeting 314 the dough 20 by rolling the dough 20 to a predetermined thickness as measured between a first surface of the dough 20 and a second surface on the dough 20; (iii) cutting 316 the dough 20 to a predetermined initial shape 26 and a predetermined initial size 28; and (iv) grooving 110 the dough 20 on at least one of the first surface and the second surface to cause the dough 20 to bend when the dough 20 is exposed to a stimuli 120, 50. For some food products, the digital fabrication process 300 also can comprise drying 330 the dough 20 after grooving 110 the dough 20.

Also, for some food products, the step of mixing 312 at least a flour and a liquid together to create a flour-based dough 20 can be performed more than one time to create more than one dough 20 and the step of sheeting 314 is performed on each dough 20. These different doughs 20 will be layered on top of each other prior to cutting 316 the dough 20 to the predetermined initial shape 26 and the predetermined initial size 28. For the digital fabrication process 300, grooving 110 the dough 20 comprises grooving 110 at least one set of parallel grooves 30 into the dough 20 perpendicular to a predetermined bending angle 42. One embodiment of the digital fabrication process 300 can include recording the data associated with the steps of mixing 312, sheeting 314, cutting 316 and grooving 110 the dough 20.

Figure 41:
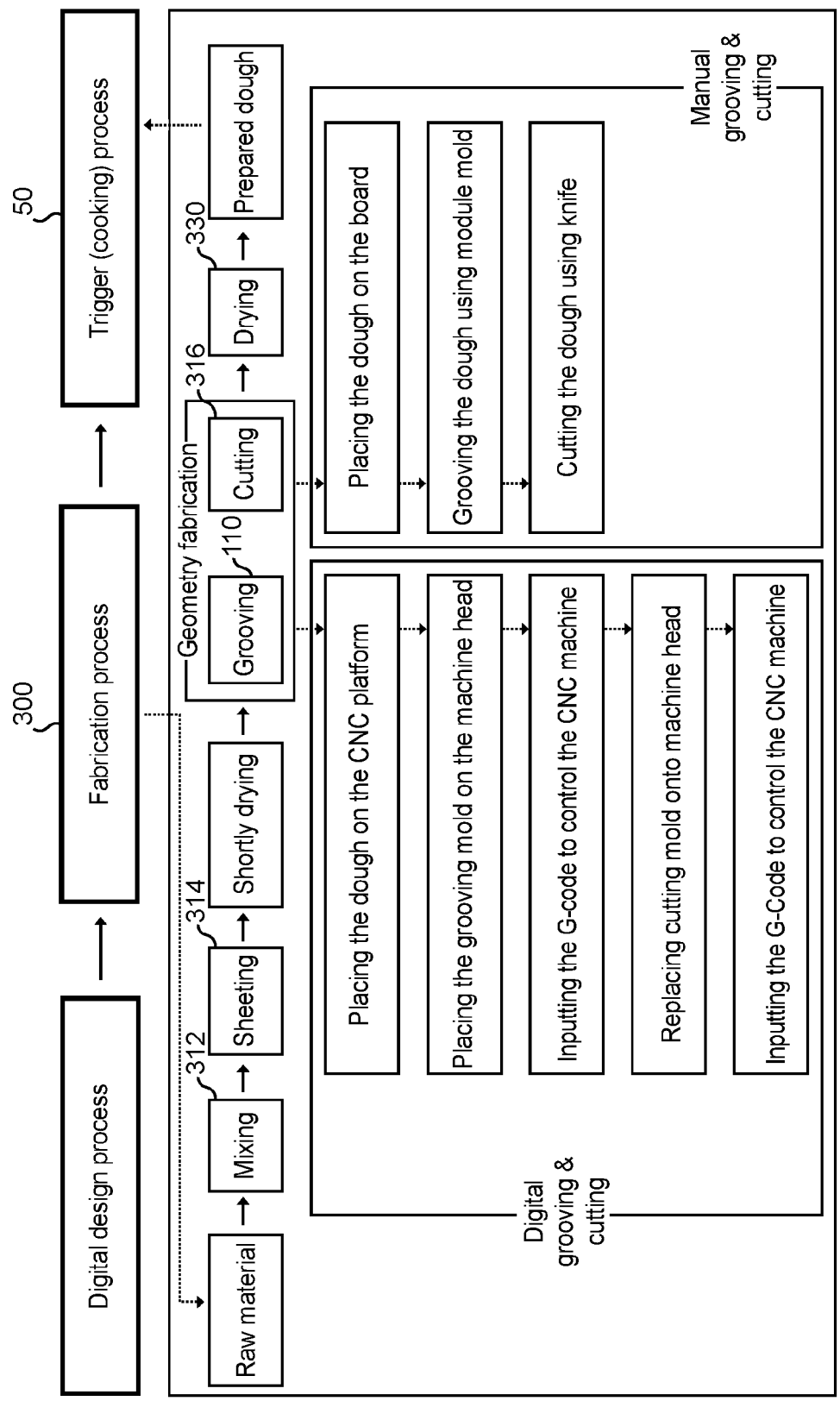
FIG. 41 illustrates the digital grooving and cutting steps and the manual grooving and cutting steps in the process of creating shape-changing food according to one embodiment of the present invention.

The flowcharts in FIGS. 39, 40 and 41 explain how the various embodiments of the present invention can be used together to go from selecting a desired design shape to producing the pasta to cooking the pasta. As illustrated in FIG. 39, the digital design process (as embodied in the computational design tool 200) involves inputting basic information regarding the desired shape, which is used to determine or select the groove design or grooving parameters. In some embodiments, the computation design tool 200 simulates the 3D shape. The information from this digital design process then can be fed into a digital fabrication process 300, in which the dough 20 is prepared via the steps of: (i) mixing the raw materials/ingredients 312, (ii) sheeting 314 the dough 20, (iii) optionally drying the dough 20 for a brief period of time, (iv) grooving 110 and cutting 316 the dough 20, and (v) optionally drying the dough 20 more completely to create a dried food product. This prepared dough 20 is then cooked by either boiling or baking.

The flowchart shown in FIG. 40 illustrates one embodiment of the computational design tool 200 in additional detail. Similarly, the flowchart shown in FIG. 41 illustrates one embodiment of the digital fabrication process 300 in greater detail. All three flowcharts illustrate how the computational design tool 200 can work with the digital fabrication process 300 to produce dough 20 that is ready to be cooked (and then is cooked). Additionally, all three flowcharts (FIGS. 39-41) illustrate and describe, through narrative labels, additional steps, inputs, outputs, substeps and details, which are discussed in greater detail throughout this application and which can be included in some embodiments of the method 100, computation design tool 200, and fabrication process 300 of the present invention but are not necessarily required in all embodiments.

Figure 11A:
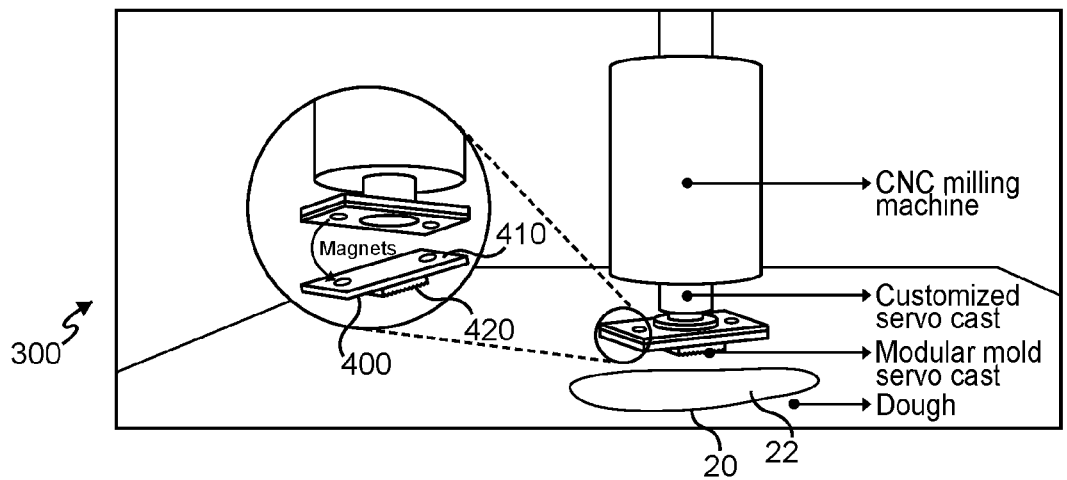
FIGS. 11A through 11C illustrate one possible digital fabrication process for the grooving process of one embodiment of the present invention.
Figure 11B:
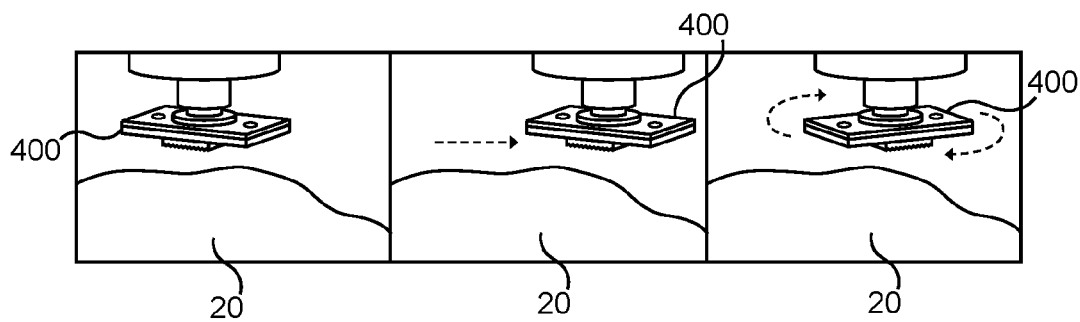
Figure 11C:
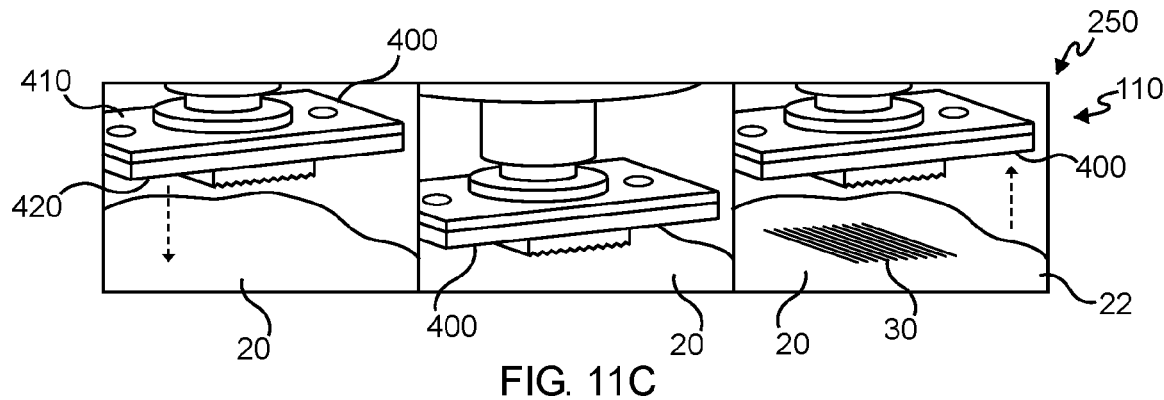

One possible embodiment of each of the method 100, design tool 200 and digital fabrication process 300 uses a four degree of freedom grooving platform that was created by modifying a 3-axis CNC milling machine (Inventables X-carve 750 mm×750 mm) which is controlled by an X-controller and a 3D carving motion controller kit distributed by Inventables. Similar machines are in FIGS. 3B and 31A, which show a stamping method controlled by an automated machine gantry to create surface grooves on sheeted pasta dough 20. It will be obvious to one skilled in the art that any machine with similar properties and abilities can be converted and/or used to accomplish the present invention's goals. This machine is compatible with the present invention's design software (see FIGS. 3A and 3B). It can take the G-code toolpath compiled by the design tool 200 and execute the grooving task 110. The spindle of the original milling machine was replaced with the present invention's novel customized servo cast that mounts a 55 g Metal Gear Servo connected vertically with a novel customized grooving mold 400 according to the present invention. A user can switch the mold 400 to another one with a different size or pitch distance according to the target transformation (as shown FIG. 11A). FIG. 11A illustrates a CNC machine equipped with a rotational tool head with a replaceable grooving mold 400. The customized tool head can groove the pasta dough 20 in various directions with 180-degree rotation range. FIGS. 11B and 11C show a grooving sequence with varied grooving angles. FIG. 11B shows a tool head moving through a cycle of rotating and grooving 110 according to the design. FIG. 11C shows the result of the automatic grooving 110. In order for a user to adjust the servo rotation angle, one embodiment of the present invention uses the spindle PWM port of the original X-controller setup. Embodiments utilizing this grooving platform and related equipment map the range of the PWM (pulse width modulation) signal to the range of a signal to control the servo rotation angle by using an external microcontroller connected with the X-controller and the servo. The microcontroller is programmed to read the PWM signal and to convert it according to the mapped range. Then, the converted digital signal is transmitted to the servo motor, which allows a user to control the servo via the X-controller by the command originally designed for setting the spindle speed. One embodiment of this process is illustrated in FIG. 41.

The newly sheeted dough 20 can be sticky, and the mold 400 can stick to the dough 20 once pressed. There are some optional steps that can be incorporated into various embodiments of the method 100, design tool 200 and digital fabrication process 300 to address this. To minimize this, the sheeted dough 20 is allowed to air dry for five minutes after sheeting 314, or whatever time is appropriate for the conditions of the dough 20 and the surrounding environment, to minimize sticking (see the "shortly drying" step in FIG. 39). Sprinkling flour on the mold 400 before pressing can prevent the dough 20 from sticking to the mold 400 as well. Additionally, cutting 316 the dough 20 with a roller cutter before or after the grooving 110 can be required depending on the target contour. For rectangular shapes, the most effective way is to cut a long strip with calculated width firstly, and then groove it with the mold 400. However, different shapes can require different cutting process 316.

For most embodiments of the present invention, the steps of grooving 110 and cutting 316 are interchangeable with respect to the order in which they are performed. By using high quality cutting blades, there is little impact of the cutting process 316 on the quality of the grooves (generally, cutting does not dull or compact the edges of the grooves). However, in limited circumstances it can be found that cutting 316 the dough 20 before grooving 110 will stretch the dough 20 and, thus, change its target contour. So, in those instances it can be preferable to groove 110 the dough 20 before cutting 316 it.

To achieve the various goals of the present invention, grooving molds 400 are designed according to the predetermined or desired groove depth 32, direction and density. Certain types and compositions of dough 20 will require the use of small pitch distances and sharp tips on the mold 400 to achieve high-quality—fine and sharp—grooves on the dough 20, and the quality of the grooves will consequentially affect the quality of the transformation performance. To quickly iterate and test the design parameters of the molds 400, one embodiment of the present invention utilizes 3D printed molds 400 with an Objet printer (Objet 24) with a 16 μm printing resolution setting. A food grade mold release (CRC 03311) is used to make the fabricated molds 400 of the present invention food safe. It will be obvious to one skilled in the art that there are other comparable printers, tools and methods 100 for creating molds 400 according to the present invention.

For one embodiment of the mold 400 and method 100, the optimized groove of the mold 400 is 3 mm deep with a 1.5 mm pitch distance. Since the groove depth 32 tends to vary depending on the applied pressure, stoppers 430 can be added to both sides of the mold 400 to maintain consistency of the groove depth 32 during the manual grooving process 110 (shown in FIG. 12A). In the digital fabrication process 300, a part modularization method was adopted to easily switch customized molds 400 with magnets (as shown in FIG. 12B); however, other methods for attaching and switching molds 400 can work and are incorporated into the present application.

Drying 330: This step is necessary only when dried flat food 10 is desired for the hydration-based transformation 52. For example, commercial pasta is often dried to prolong the shelf life. Depending upon the composition of the dough 20 some hydration can need to be included in the drying 330 process to prevent the grooved dough from cracking. This additional hydration can be accomplished by introducing a mist of water or a bit of steam in the drying process. All of the shape-changing mechanisms of the present invention work for both fresh and dried dough 20.

Figure 13:
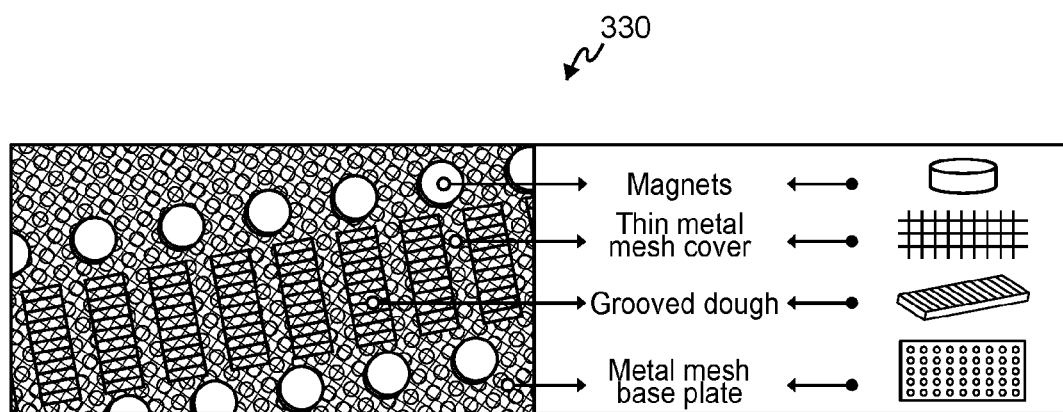
FIG. 13 illustrates an optional drying process according to one embodiment of the hydration-based shape-changing food of the present invention.

One drying method 330 is shown in FIG. 13. This process takes 12-24 hours. The cover and the base plate with mesh holes are aimed to accelerate the process by allowing large airflow to contact with the sheeted dough 20. Any other acceptable drying method 330 can be used as well and many are known within the art.

Figures 14A, 14B:
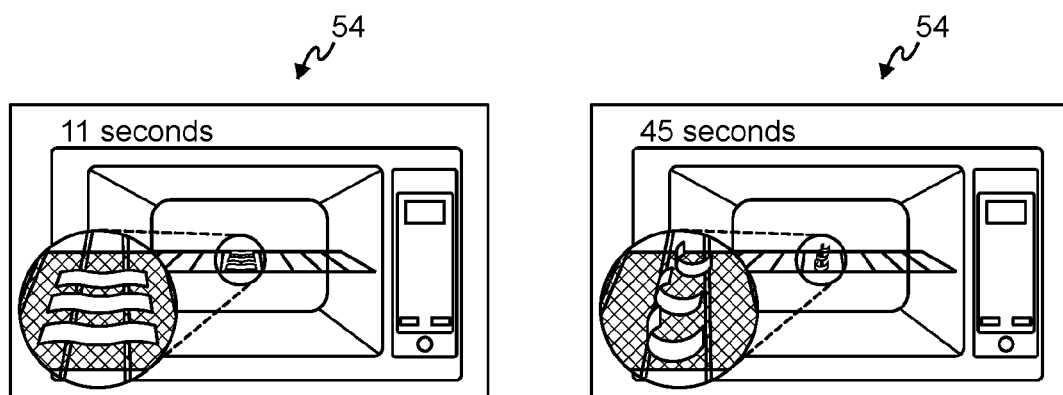
FIGS. 14A and 14B illustrate one setup of a dehydration cooking process according to one embodiment of the present invention.

Dehydration-based Transformation—Setup: As FIG. 14 shows, a convection oven (Oster) is one example of a dehydration 54 cooking (i.e. baking) environment that can be used with the present invention. It will be obvious to one skilled in the art that many different kinds of ovens and heat sources will work with, and are incorporated into, the present application. For example, a low-speed and convection-based dehydration process 54 enhances the bending performance. Thus, the oven can be set to 200° F. with turbo convection function under bake mode, and the oven kept open with a fan to accelerate air movement. Other temperatures and times may need to be used with different ovens, doughs 20, environments and dehydration methods 54. Over a period of 90 minutes, the deformation behavior started in around 4 minutes, and the maximum deformation behavior occurred in about 45 minutes. FIG. 14A shows wet samples in the oven after 11 seconds of baking. FIG. 14B shows samples that have been transformed after 45 minutes of baking.

Figure 15A:
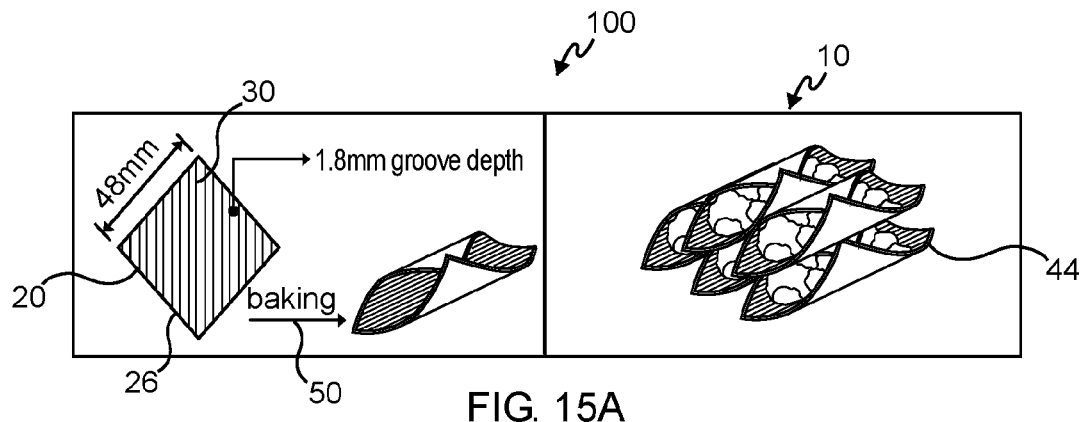
FIGS. 15A and 15B illustrate two embodiments of a preparation process for foods according to the present invention.
Figure 15B:
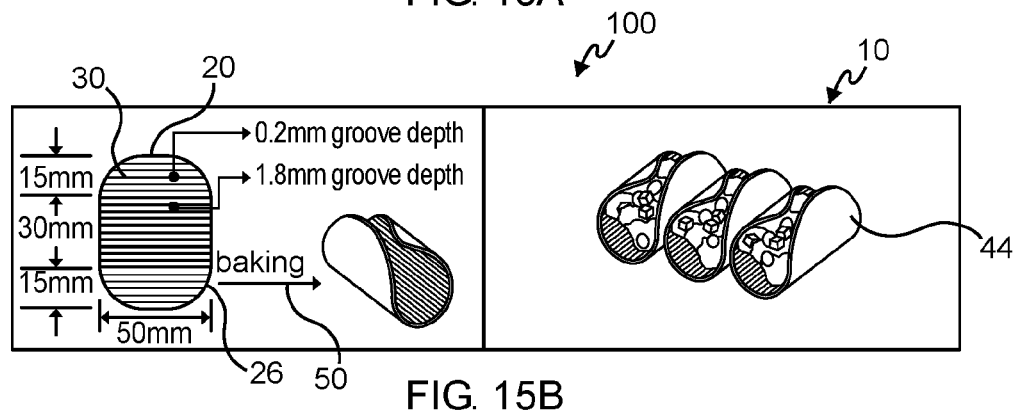

Applications—Self-wrapping tacos and cannoli: FIG. 15 shows the preparation process and the final shape 44 of baking-induced self-wrapping covers made of flour dough 20 according to one embodiment of the method 100. This method 100 starts with flat shape dough 20 and saves the preparation efforts. FIG. 15A illustrates self-wrapping tacos and FIG. 15B illustrates self-wrapping cannoli.

Figure 16A:
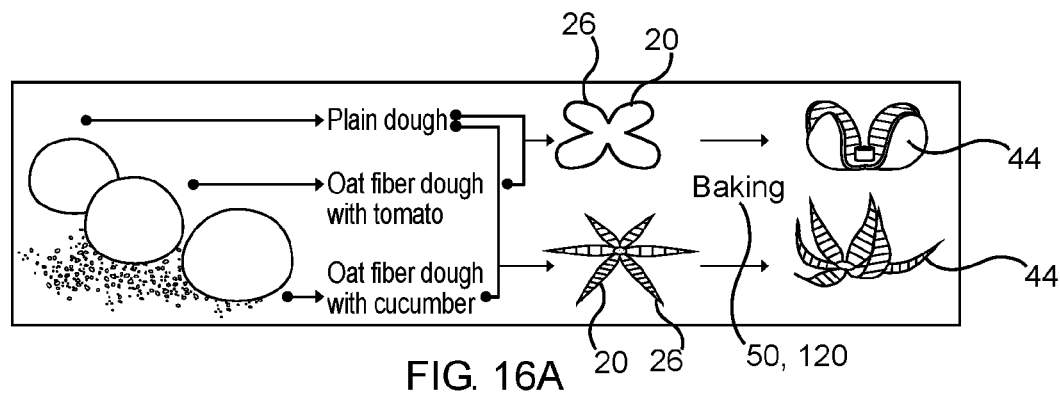
FIGS. 16A and 16B illustrate one possible preparation process for self-folding cookies and the final shape of those cookies according to the present invention.
Figure 16B:
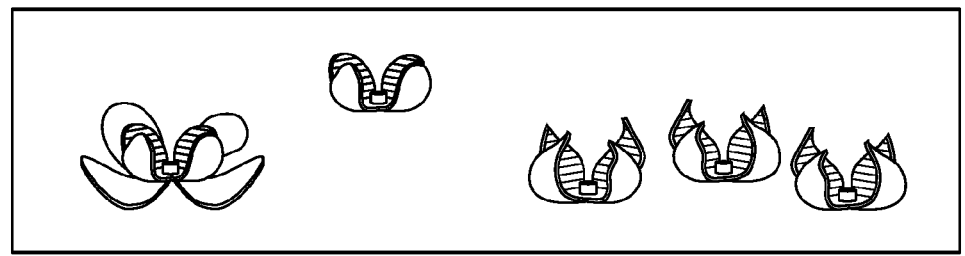

Multi-Flavored cookies: Various embodiments of the present invention involve the use of composite dough 20 with different flavors and nutrition components. FIG. 16 shows that different types of dough 20 can work as raw materials for self-folding baked food 10. FIG. 16A illustrates the preparation process of self-folding cookies with different flavors and nutrition contents. FIG. 16B further illustrates the final shape 44 of the cookies of FIG. 16A after baking.

Figure 17A:
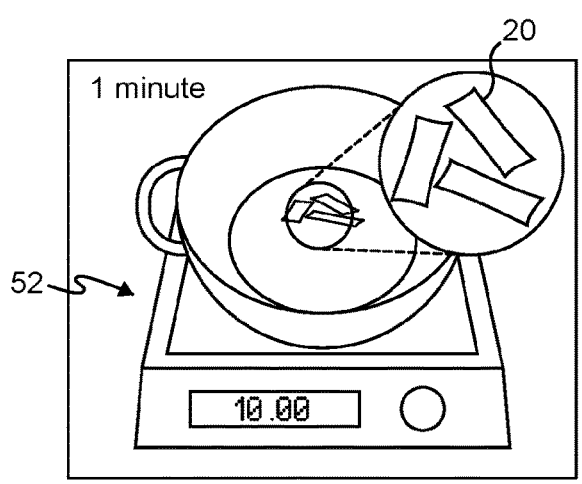
FIGS. 17A and 17B illustrate one embodiment of a set-up for hydration cooking according to the present invention.
Figure 17B:
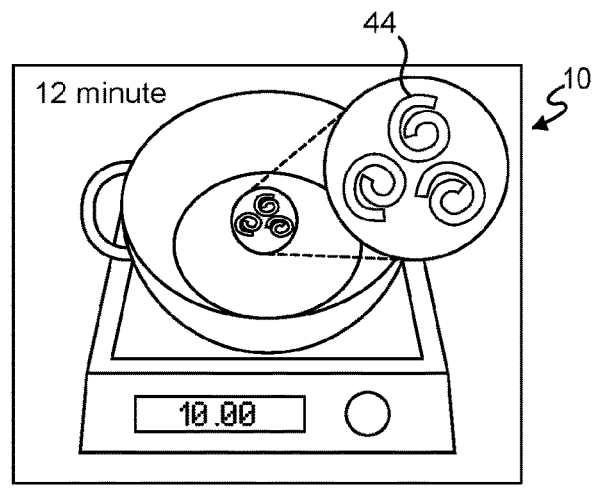
Figure 18A:
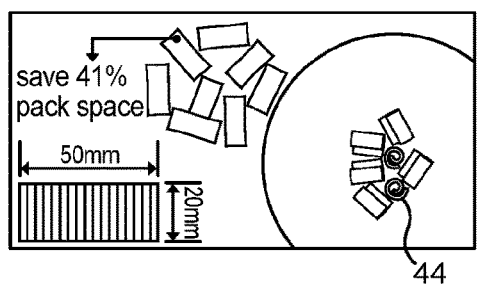
FIGS. 18A through 18D show various types of flat-pack hiking foods before and after cooking according to the present invention.
Figure 18B:
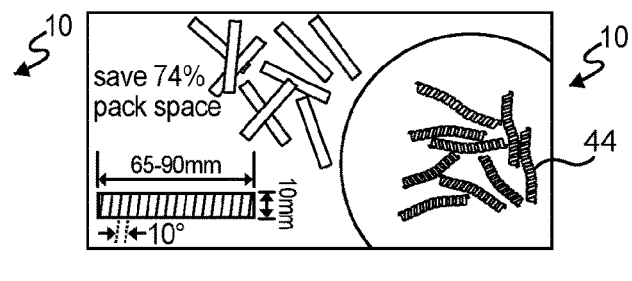
Figure 18C:
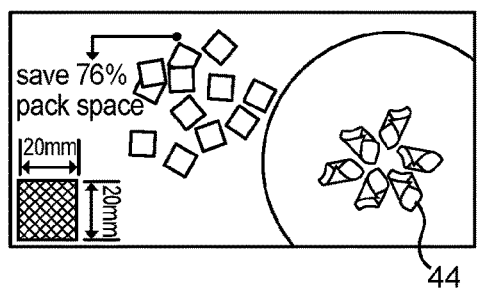
Figure 18D:
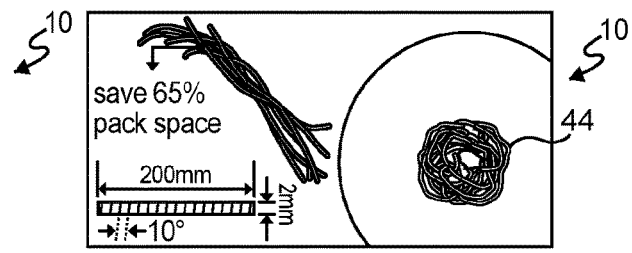
Figures 19A, 19B, 19C, 19D:
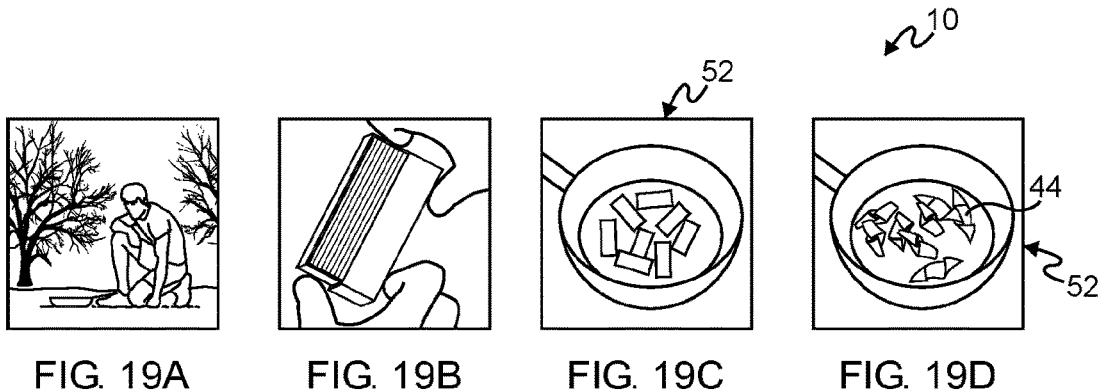
FIGS. 19A through 19G illustrate various field cooking experiences according to the present invention.
Figures 19E, 19F, 19G:
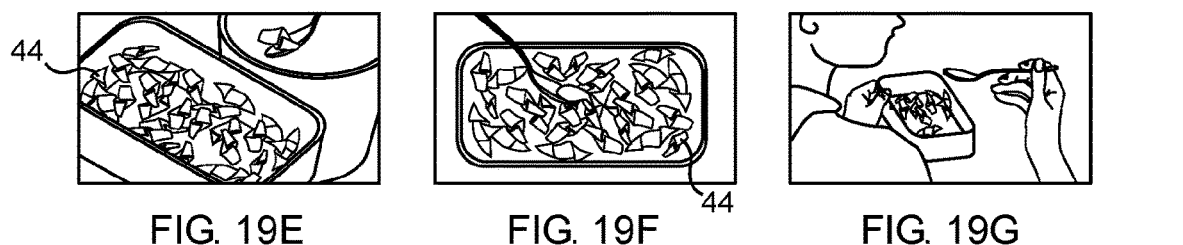
Figures 20A, 20B, 20C, 20D:
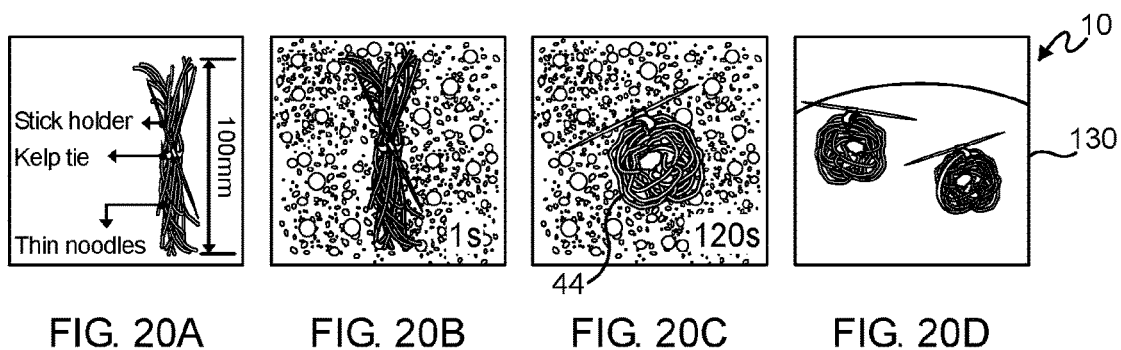
FIGS. 20A through 20D show one embodiment of self-assembling noodle balls according to the present invention.

Hydration-based-Transformation—Setup: As FIG. 17 shows, an induction cooker (Rosewill RHAI-13001) can be used as the hydration cooking (i.e. boiling) 52 environment. It will be obvious to one skilled in the art that many different types of cookers, stoves, stovetops, hotplates and heat sources can also be used for the present invention and the cooking times may need to be adjusted for each cooking environment. Using the same method as for pasta, the water is boiled and the pasta is placed into the pot for 12 to 15 min. The transformation begins shortly after the pasta enters the boiling water (FIG. 17A), reaching its maximum bending angle 42 after about 12 min (FIG. 17B), and retaining the angle within 20 min. Hence, users can decide when to stop the cooking depending on the preferred and/or desire mouthfeel.

Flat-pack for Mountain Hikers: Various embodiments of the present invention include at least four transformation types for flat packed hiking food 10. In previous work, Transformative Appetite envisioned a scenario involving shape changing gelatin-based food flat-packing. The present invention brought this vision into reality. One embodiment of the present invention includes four examples of semolina flour-based pasta that can save packing spaces ranging from 41% to 76% (shown in FIGS. 18A through 18D). FIGS. 19A through 19G show that the food 10 was cooked and consumed in an outdoor environment with a compact gas heater.

Self-assembling Noodle Balls for Accessibility: The shape-changing property of noodles made according to the present invention suggests a new type of eating experience for those who have difficulty using common utensils including forks and chopsticks. For example, a pile of thin noodles with a wood stick can be transformed into a lollipop-shaped noodle ball so that children who have not learned how to use forks can handle eating long noodles. With this method, they can easily hold the stick and feed themselves (as shown in FIGS. 20A through 20D). The present invention leverages the advantages of shorter cooking time and flat-packing capabilities, in addition to the post-assembled shape to improve accessibility for the young, handicapped and the elderly.

Figures 21A, 21B:
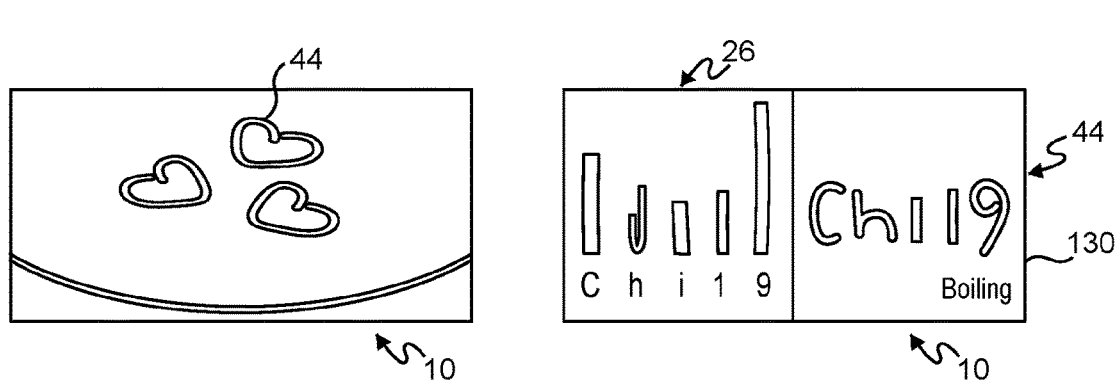
FIGS. 21A and 21B show some examples of food as information displays according to the present invention.

Edible Information Display: Pasta noodles made according to the present invention can be transformed on the dining table while they are being served, potentially providing a rich platform for diners to experience interactive information delivery. This interaction provides different types of information by, among other things, heating a metal plate that is responsive to various kinds of stimuli, like music. With this platform, people can send messages served on dishes. Various embodiments of the present invention incorporate, but are not limited to, the following scenarios: a metal plate containing uncooked angel hair noodles is served to a diner's table. A violinist comes to the table and plays a song, 'Salut d'amour'. Upon recognizing the song, the heating table begins heating the plate. The pasta cooks on the heated plate within 5-6 minutes and changes into a heart shape, conveying a message of love from the diner's partner (shown in FIG. 21A). FIG. 21B shows that customized texts can appear as lines are being cooked. FIGS. 22A through 22C illustrate how the heart shape was designed, simulated, and put in action as it was cooked. FIGS. 22 and 22B show a design tool 200 to customize 220 and simulate 230 the transformation of food 10 for a special event. FIG. 22C illustrates the actual transformation behaviors of the dough 20.

These novel foods 10 provide distinct advantages over prior shape-changing food technologies and new applications for shape-changing foods 10. For example, some embodiments of the present invention hold sauce better than the traditional pasta because of its bent shape. As a result, shape changing pasta 10 tastes more savory and can be created to have more elastic and volumetric texture than traditional pastas or previous shape-changing foods 10. Additionally, it may be easier to hold the shape-changing pasta with utensils because of its resilient texture and curved shape. The present invention's pastas have a more traditional mouthfeel than previous shape-changing pastas; however, the present invention's pasta with the same thickness may need to be cooked for one or two minutes longer than normal pasta to achieve an al dente consistency. This is due to the groove structure on the surface of the pasta of the present invention.

Figure 26A:
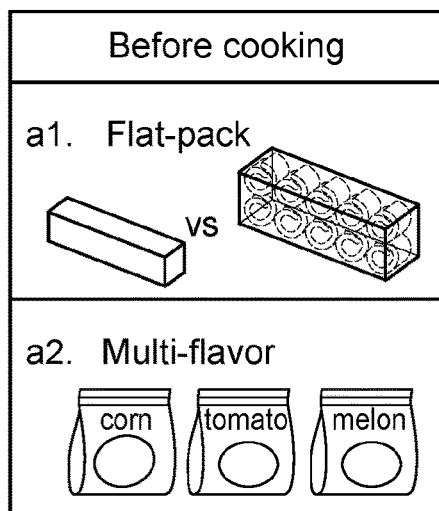
FIGS. 26A through 26C show some of the design spaces that open up with the present invention.
Figure 26B:
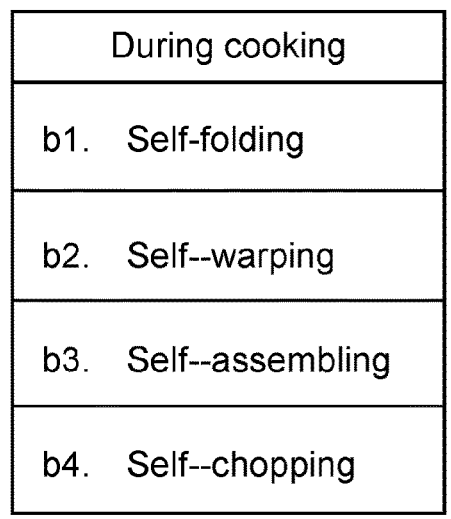
Figure 26C:
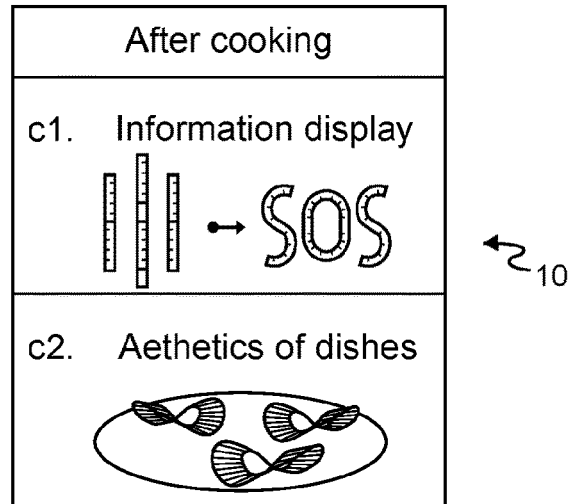

The present invention opens up multiple design spaces for shape changing food 10, some examples of which are shown in FIGS. 26A through 26C. As shown in FIG. 26A, the present invention provides space-saving advantages because of its flat-packing and multi-flavor options. Additionally, there is the novelty of the morphing processes of self-folding, self-wrapping-self-assembly and self-chopping (FIG. 26B). Finally, he novel shape-changing attributes of the present invention create a new food entertainment experience, as exemplified in FIGS. 23A and 23B and FIG. 26C. Diners can watch pasta transform its shape in the boiling water and showcase the cooking process at parties as a performance. Additionally, the present invention's shape-changing foods 10 have the ability to deliver visual information. Pastas according to the present invention can be shaped to represent different characteristics including flavor, nutrition, or even cooking time. For example, creating pasta that utilizes letters as visualization cues. A few nonlimiting examples might be an S-shaped pasta that is "sweet", a U-shaped pasta that is "umami", or a G-shaped pasta that is "gluten-free". Additionally, a cook can easily tell if the pasta is ready to eat when the pasta reaches its target shape, which negates the need for tasting the pasta during the cooking process. Alternatively, the pasta can be programmed to transform from the flat shape to an R-shape when it is "ready" to be served. The present invention's pasta can even be customized to a customer's requested shape. Foods 10 prepared according to the present invention also can be designed to reduce the hands-on time or preparation time of certain foods. For example, when preparing dishes that form a container, i.e. wraps or dumplings, traditional preparation methods involve additional time to fill and close the wraps. Wraps and dumplings according to the present invention can be designed to self-wrap and eliminate this step in the traditional preparation process. Some examples of this aspect of the present invention are shown in FIG. 15 and FIG. 17.

As suggested previously, foods 10 prepared according to the present invention enable flat-packed foods 10 to have a wider variety of shapes when cooked. For example, when hiking on long duration trips, the weight, package size, and packaging and product shape become important to efficient packing and to the ability for hikers to get rid of food and make their packs lighter as the trip progresses. At the intersection of these constraints and the available equipment, there lies an opportunity for the implementation of the present invention's shape changing pasta. Packaging for food 10 made according to the present invention can be both flat and efficient because the food 10 starts out with a flat shape. However, the present invention's foods 10 can be designed to cook up into a variety of different shapes using traditional camping and hiking equipment. This provides hikers with food variety previous unattainable in efficiently packed food products.

Figure 33:
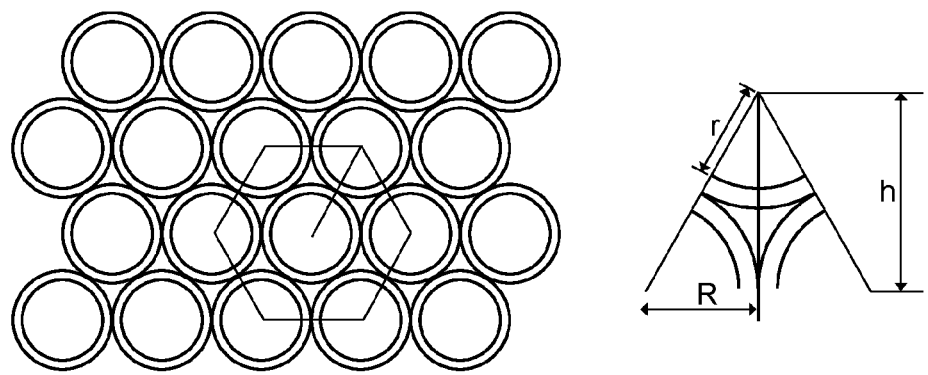
FIG. 33 illustrates the space saving potential of flat-packed pasta.

In modern society, a large portion of food is produced remotely and shipped to customers, resulting in pollution to the air due to the emissions of greenhouse gases to the environment. The flat-packed food 10 of the present invention helps to alleviate pollution by reducing the amount of air shipped during food transport (FIGS. 18A through 18D, 32B and 33). Contributing to sustainable food packaging, the morphing pasta saves 41% to 76% packaging space compared to conventional three dimensional pasta (FIGS. 18, 32 and 33). Take a package containing short macaroni pasta as an example (FIG. 32B), the densest packing of tubes (side view of the pasta) in the plane is the hexagonal lattice of the bee's honeycomb. The packing density (θ) can be calculated to establish that 67.3% of volume in the package is air. The present invention takes flat-pack pasta and transforms it into 3D shapes during cooking, therefore, more than half of the space during shipping and storage will be saved. For the helical shaped pasta packaged as a hiking food 10 (FIG. 19), this flat-pack approach can save up to 72.9% of packaging space.

The application demo previously described in FIG. 19 demonstrates this idea that the present invention is, among other things, a novel and simple mechanism for morphing flour-based dough 20, during either the dehydration 54 or hydration 52 cooking process. The various embodiments of the present invention include these novel dough 20 and food products 10, a customized design software and a digital manufacturing platform and novel food molds 400. Applications are developed to indicate the potential design space for flour-based shape-changing food 10, as shown in FIG. 32B (illustrating a calculation on the space saved from 2D to 3D morphing). Both baked and boiled foods 10 are designed with shape-changing behaviors. Beyond the realization of flat-pack authentic pasta, the present invention also encompasses novel use-case scenarios including food 10 as an information display, food 10 that transforms for accessibility, and food 10 that self-wraps and saves the effort of preparation and cooking. On a higher level, the present invention illustrates how food can become media that transforms and interacts with cooks and diners (FIGS. 23A and 23B). By pushing the utilization of authentic and natural food ingredients, the present invention can be adapted further for real-world use and commercialization.

The previous and following explanation describes example embodiments in which the present invention may be practiced. This invention, however, may be embodied in many different ways, and the description provided herein should not be construed as limiting in any way. Among other things, the following invention may be embodied as methods or devices. The detailed descriptions of the various embodiments of the present invention should not be taken in a limiting sense.

What is claimed is:

1. A shape-changing pasta comprising:
    a flat piece of flour-based dough having a top surface and a bottom surface and comprised of at least two layers of flour-based doughs, wherein:
    the flat piece of flour-based dough is comprised of semolina flour;
    each layer of the flat piece of flour-based dough has a different composition and a predetermined thickness;
    the flat piece of flour-based dough, having the at least two layers, is cut to an initial shape and an initial size; and
    the top surface has at least one groove running perpendicular to a predetermined bending direction and the at least one groove has a predetermined groove
    depth and a predetermined groove spacing chosen that operate to cause the dough to bend in response to hydration or dehydration to achieve a predetermined final shape or a predetermined bending angle.

2. The shape-changing pasta of claim 1, wherein the predetermined groove depth determines a maximum bending angle wherein a deeper groove depth causes a larger maximum bending angle.

3. The shape-changing pasta of claim 1, wherein at least one dough layer is comprised of semolina flour and egg whites and at least one other dough layer is comprised of semolina flour and oat fiber.

4. The shape-changing pasta of claim 3, wherein a predetermined final shape or a predetermined bending angle of the flat piece of flour-based dough is achieved by selecting the composition of each layer of dough.

5. The shape-changing pasta of claim 3, wherein a predetermined final shape or a predetermined bending angle of the flat piece of flour-based dough is achieved by selecting the thickness of each layer of dough.

6. The shape-changing pasta of claim 3, wherein a predetermined final shape or a predetermined bending angle of the flat piece of flour-based dough is achieved by selecting a ratio of the thicknesses of the layers of dough.

7. The shape-changing pasta of claim 1, wherein the at least one groove is imprinted onto the top surface.

8. The shape-changing pasta of claim 1, wherein the hydration is boiling and the dehydration is baking.

9. The shape-changing pasta of claim 1, wherein the flat piece of flour-based dough is comprised of at least one flour and at least one liquid.

10. The shape-changing feed pasta of claim 1, wherein the at least one groove is a plurality of parallel grooves.

11. The shape-changing pasta of claim 10, wherein the at least one set of parallel grooves covers the top surface of the flat piece of flour-based dough.

12. The shape-changing pasta of claim 1, wherein the bottom surface has at least one groove running perpendicular to a predetermined bending direction, and wherein the at least one groove has a groove depth and a groove spacing chosen to achieve a predetermined final shape or a predetermined bending angle.

* * * * *